US012160186B2

(12) United States Patent
Ashizawa et al.

(10) Patent No.: US 12,160,186 B2
(45) Date of Patent: Dec. 3, 2024

(54) MEMS ELEMENT AND VIBRATION-DRIVEN ENERGY HARVESTING DEVICE

(71) Applicant: Saginomiya Seisakusho, Inc., Tokyo (JP)

(72) Inventors: Hisayuki Ashizawa, Sayama (JP); Noriko Shimomura, Sayama (JP)

(73) Assignee: Saginomiya Seisakusho, Inc., Tokyo (JP)

( * ) Notice: Subject to any disclaimer, the term of this patent is extended or adjusted under 35 U.S.C. 154(b) by 0 days.

(21) Appl. No.: 17/766,930

(22) PCT Filed: Oct. 9, 2020

(86) PCT No.: PCT/JP2020/038350
§ 371 (c)(1),
(2) Date: Apr. 6, 2022

(87) PCT Pub. No.: WO2021/070947
PCT Pub. Date: Apr. 15, 2021

(65) Prior Publication Data
US 2024/0097581 A1 Mar. 21, 2024

(30) Foreign Application Priority Data
Oct. 10, 2019 (JP) ................................ 2019-187153

(51) Int. Cl.
*H02N 1/08* (2006.01)
(52) U.S. Cl.
CPC ..................... *H02N 1/08* (2013.01)
(58) Field of Classification Search
CPC ................... H02N 1/08; H02N 1/00
(Continued)

(56) References Cited

U.S. PATENT DOCUMENTS

2002/0104377 A1* 8/2002 Ishio ............... B81B 3/0008
73/514.32
2015/0183636 A1 7/2015 Akiba et al.
(Continued)

FOREIGN PATENT DOCUMENTS

JP 2002-228680 A 8/2002
JP 2016-209935 A 12/2016
(Continued)

OTHER PUBLICATIONS

International Preliminary Report on Patentability dated Apr. 21, 2022, issued in PCT Application No. PCT/JP2020/038350, filed Oct. 9, 2020.
(Continued)

*Primary Examiner* — Jose A Gonzalez Quinones
(74) *Attorney, Agent, or Firm* — Workman Nydegger

(57) ABSTRACT

This MEMS element comprising: a base; a movable portion; and an elastic portion, and a fixing portion; and a fixed portion body to which the elastic portion is fixed, wherein the elastic portion extends in a direction intersecting a moving direction of the movable portion, includes a central portion receiving a force of the movable portion, and one end and another end fixed to the fixed portion body, and includes thin portions respectively between the central portion and the one end and between the central portion and the other end, the thin portions being thinner than the central portion, the one end, and the other end.

17 Claims, 10 Drawing Sheets

(58) Field of Classification Search
USPC .......................................................... 310/309
See application file for complete search history.

(56) References Cited

U.S. PATENT DOCUMENTS

| | | | |
|---|---|---|---|
| 2017/0373611 A1* | 12/2017 | Cottone | .................. H02N 1/08 |
| 2018/0252744 A1* | 9/2018 | Kamada | .................. G01P 15/18 |
| 2019/0094262 A1 | 3/2019 | Ito | |
| 2021/0119556 A1 | 4/2021 | Toshiyoshi et al. | |

FOREIGN PATENT DOCUMENTS

| | | |
|---|---|---|
| JP | 2018-088780 A | 6/2018 |
| JP | 2018-146330 A | 9/2018 |
| JP | 2019-039804 A | 3/2019 |

OTHER PUBLICATIONS

Extended European Search Report dated Sep. 19, 2023, issued in EP Application No. 20874103.3.

* cited by examiner

MEMS ELEMENT AND VIBRATION-DRIVEN ENERGY HARVESTING DEVICE

TECHNICAL FIELD

The present invention relates to a MEMS element and a vibration-driven energy-harvesting device.

BACKGROUND ART

Vibration-driven energy-harvesting devices produced by processing silicon substrates with micro electro-mechanical system (MEMS) process techniques have been known. A vibration-driven energy-harvesting device has a structure in which teeth provided in a movable electrode supported by elastic supporting portions are disposed to be insertable into and retractable from gaps between teeth provided in fixed electrodes. An external impact applied to the vibration-driven energy-harvesting device causes the elastically supported movable electrode to vibrate with respect to the fixed electrodes. The teeth of the movable electrode are accordingly inserted into and retracted from the gaps between the teeth of the fixed electrodes, resulting in electric power generation.

In each fixed electrode, which is a fixed portion, an elastic regulating member provided in the fixed electrode receives acceleration generated by external vibrations in the movable electrode, which is a movable portion, thereby regulating the vibration range of the movable electrode. The elastic regulating member in the fixed electrode therefore requires rigidity capable of tolerating acceleration forces of the movable electrode. Unfortunately, in conventional MEMS elements, increasing the spring constant of the elastic regulating member makes the elastic regulating member prone to damages from stress concentrated in basal regions of an elastic portion of the elastic regulating member. This prevents increasing the amount of power generatable.

An exemplary structure of the fixed electrode having the elastic regulating member includes a slit provided in an inner region of a side portion of the fixed electrode so that the side portion of the fixed electrode serves as the elastic regulating member (e.g., see FIG. 5 in Patent Literature 1).

CITATION LIST

Patent Literature

Patent Literature 1: Japanese Patent Laid-Open No. 2018-88780

SUMMARY OF INVENTION

Technical Problem

FIG. 5 in Patent Literature 1 shows a structure of a fixed portion in which, along a side surface with which a movable electrode collides, a slit is provided in an inner region of the side surface. This structure, however, is limited by the inability to receive strong forces of vibrations of the movable portion.

Solution to Problem

A MEMS element according to a first aspect of the present invention includes: a base; a movable portion fixed to the base in at least a portion of the movable portion and movable in a predetermined direction; and a fixed portion fixed to the base in at least a portion of the fixed portion, the fixed portion including: an elastic portion provided to be opposed to the movable portion; and a fixed portion body to which the elastic portion is fixed, wherein the elastic portion extends in a direction intersecting a moving direction of the movable portion, includes a central portion receiving a force of the movable portion, and one end and another end fixed to the fixed portion body, and includes thin portions respectively between the central portion and the one end and between the central portion and the other end, the thin portions being thinner than the central portion, the one end, and the other end.

According to a second aspect of the present invention, in the MEMS element in the first aspect, preferably, the elastic portion is formed to have a gently curved surface between the central portion and each thin portion.

According to a third aspect of the present invention, in the MEMS element in the first or second aspect, preferably, a side surface of the central portion of the elastic portion facing the movable portion protrudes toward the movable portion more than side faces of the thin portions.

According to a fourth aspect of the present invention, in the MEMS element in the first or second aspect, preferably, a side surface of the movable portion facing the fixed portion has a protruding portion opposed to the central portion of the fixed portion.

According to a fifth aspect of the present invention, in the MEMS element in any of the first to third aspects, preferably, a slit extending along the elastic portion and penetrating the fixed portion body is provided between the elastic portion and the fixed portion body, and a side surface of the elastic portion facing the movable portion is formed to be gently curved to allow stress generated by the force received from the movable portion to be substantially uniform across a surface of the central portion and surfaces of the thin portions.

According to a sixth aspect of the present invention, in the MEMS element in any of the first to third aspects, preferably, the elastic portion includes four beam sections, a slit extending along the elastic portion is provided between the elastic portion and the fixed portion body, and at least one of a side surface of the elastic portion facing the movable portion and a side surface of the elastic portion closer to the slit has a substantially parabolic structure including: a first beam section having a substantially parabolic curved surface with a basal portion fixed to one end of the fixed portion body; a second beam section having a substantially parabolic curved surface connected with the first beam section on a vertex side; a third beam section having a substantially parabolic curved surface integrated with the second beam section in a basal portion; and a fourth beam section having a substantially parabolic curved surface connected with the third beam section on a vertex side and fixed to another end of the fixed portion body in a basal portion.

According to a seventh aspect of the present invention, in the MEMS element in the sixth aspect, preferably, the side surface of the elastic portion facing the movable portion, between the central portion and the one end, has a shape such that a substantially parabolic curved surface extending from a center of the central portion is coupled with a substantially parabolic curved surface extending from the one end at vertices of the substantially parabolic curved faces, and the side surface of the elastic portion closer to the slit is formed flat.

According to an eighth aspect of the present invention, in the MEMS element in the sixth or seventh aspect, preferably, a thickness w(y) of the elastic portion is set to substantially satisfy an equation $$w(y)=w_0\sqrt{|1-4|y|/L|},$$

where w(y) is a thickness of a parabolic beam at a position y that is a length y away from a center of a beam length of the elastic portion, $w_0$ is a thickness at the one end of the elastic portion, |y| is an absolute of the length from the center of the beam length of the elastic portion to the position y, and L is an entire length of the beam length of the elastic portion.

According to a ninth aspect of the present invention, in the MEMS element in the first aspect, preferably, a slit extending along the elastic portion is provided between the elastic portion and the fixed portion body, and the slit includes a first slit portion provided to correspond to the central portion of the elastic portion, and second slit portions connected to the first slit portion and provided on an inner side of the elastic portion near the one end and the other end, and a width of the second slit portions in the moving direction of the movable portion is greater than a width of the first slit portion.

According to a tenth aspect of the present invention, in the MEMS element in the ninth aspect, preferably, a stopper portion is provided in a region of the fixed portion body opposed to the first slit portion, and a tip surface of the stopper portion is an ultimate regulating tip surface that ultimately regulates the force of the movable portion received via the elastic portion.

A MEMS element according to an eleventh aspect of the present invention includes: a base; a movable portion fixed to the base in at least a portion of the movable portion and movable in a predetermined direction; and a fixed portion including: a fixed portion body fixed to the base in at least a portion of the fixed portion body; an elastic portion fixed to the fixed portion body; and a slit extending along the elastic portion between the elastic portion and the fixed portion body and provided to penetrate the fixed portion body, wherein the elastic portion has a beam structure including: a central portion extending in a direction intersecting a moving direction of the movable portion and receiving a force of the movable portion; and one end and another end fixed to the fixed portion body, the slit includes a first slit portion provided to correspond to the central portion of the elastic portion, and second slit portions connected to the first slit portion and provided on an inner side of the elastic portion near the one end and the other end, the second slit portions are formed to have a width in the moving direction of the movable portion greater than a width of the first slit portion, arc-shaped curved portions are provided respectively in the second slit portions near corner portions at the one end and the other end of the elastic portion, and a radius of curvature of the arc-shaped curved portions is greater than a radius of curvature of a circle inscribed in the first slit portion.

According to a twelfth aspect of the present invention, in the MEMS element in the eleventh aspect, preferably, the elastic portion includes thin portions respectively between the central portion and the one end and between the central portion and the other end, the thin portions being thinner than the central portion, the one end, and the other end.

According to a thirteenth aspect of the present invention, in the MEMS element in any of the first to twelfth aspects, preferably, the base, the fixed portion, and the movable portion are made of silicon.

According to a fourteenth aspect of the present invention, in the MEMS element in the thirteenth aspect, preferably, the movable portion includes a plurality of movable teeth and a tooth-connecting portion connecting the plurality of movable teeth, and the fixed portion includes a plurality of fixed teeth, the plurality of movable teeth of the movable portion being inserted into and retracted from gaps between the plurality of fixed teeth.

According to a fifteenth aspect of the present invention, in the MEMS element in the fourteenth aspect, preferably, an electret is formed in at least one of: each of the plurality of movable teeth; and each of the plurality of fixed teeth.

A vibration-driven energy-harvesting device according to a sixteenth aspect of the present invention includes: the MEMS element in any of the first to fifteenth aspects; an elastic supporting portion via which the movable portion of the MEMS element is elastically supported to the fixed portion; and an output portion outputting electric power generated by vibration of the movable portion with respect to the fixed portion.

Advantageous Effect of Invention

The present invention can provide a MEMS element and a vibration-driven energy-harvesting device that employ a structure for restricting the amount of movement of a movable portion, and that are resistant to damages from strong external forces.

BRIEF DESCRIPTION OF DRAWINGS

FIG. 4 is a principle diagram of a pseudo beam of uniform strength, formed of parabolas, in which FIG. 4(A) is a side view illustrating the shape of an elastic portion allowing stress to be substantially uniform across the entire length of the surfaces of side surfaces, and FIG. 4(B) is an enlarged view of a region $IV_B$ in FIG. 4(A).

FIG. 7 is a perspective view illustrating simulated stress distribution occurring in elastic portions, in which FIG. 7(A) is for a structure in the comparative example and FIG. 7(B) is for a structure in the embodiment.

DESCRIPTION OF EMBODIMENTS

An embodiment for carrying out the present invention will be described below with reference to the drawings.

Figure 1:
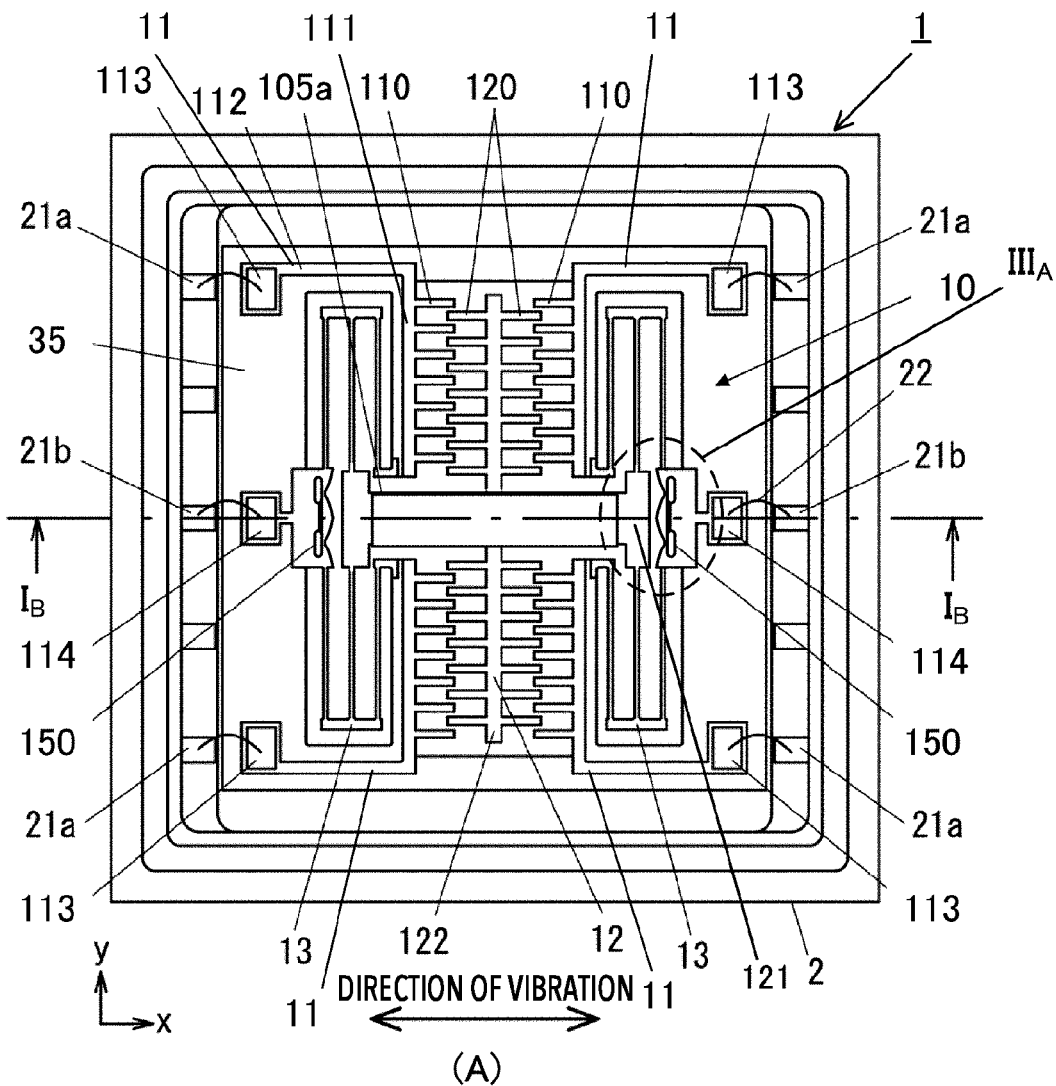
FIG. 1(A) is a plan view illustrating a vibration-driven energy-harvesting device, viewed through a upper cover assumed to be transparent, in which a MEMS element is enclosed in a vacuum package.
FIG. 1(B) is a cross-sectional view taken along a line $I_B$-$I_B$ in FIG. 1(A).
Figure 1:
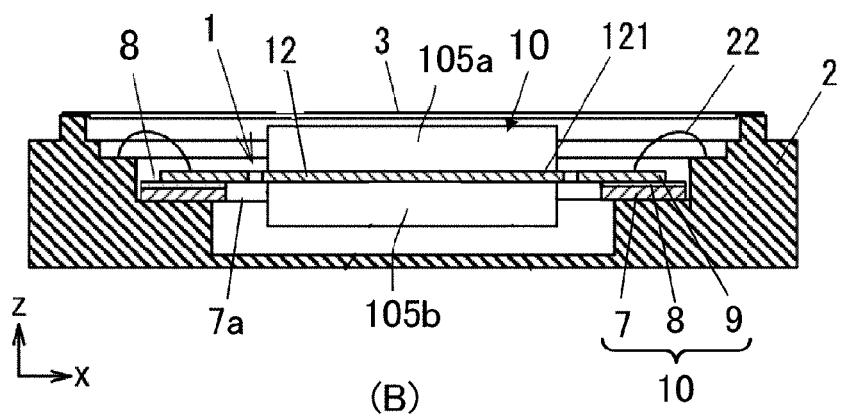

FIG. 1(A) is a plan view illustrating a vibration-driven energy-harvesting device 1, viewed through a upper cover 3 assumed to be transparent, in which a MEMS element 10 is enclosed in a vacuum package. FIG. 1(B) is a cross-sectional view taken along a line $I_B$-$I_B$ in FIG. 1(A).

A case 2 and the upper cover 3 form the vacuum package, which houses the MEMS element 10. For clear illustration of the planar structure of the MEMS element 10, the plan view in FIG. 1(A) does not show the upper cover 3 provided on the upper side (the positive z-axis direction side).

Note that the x-axis direction, y-axis direction, and z-axis direction in this embodiment are supposed to be the respective directions shown in each figure.

The MEMS element 10 includes four fixed electrode portions 11, a movable electrode portion (movable portion) 12, and elastic supporting portions 13 elastically supporting the movable electrode portion 12. A base 7 of the MEMS element is fixed to the case 2 by die bonding. The case 2 is formed of, for example, an electric insulation material (e.g., ceramic). The upper cover 3 is seam welded to the upper end of the case 2 to vacuum seal the case 2.

The MEMS element 10 includes the base 7 made of Si, a device layer 9 made of a Si active layer, and a bonding layer 8 made of an inorganic insulation material such as $SiO_2$ and bonding the base 7 and the device layer 9. The MEMS element 10 is thus configured as a three-layer structure in which the base 7, the bonding layer 8, and the device layer 9 made of a Si active layer are stacked in the z-axis direction, as illustrated in FIG. 1(B). The MEMS element 10 having such a configuration is typically produced from a silicon on insulator (SOI) substrate by a general MEMS process technique.

The device layer 9 includes the four fixed electrode portions 11, the movable electrode portion 12, and a fixed-electrode outer periphery portion 35. The fixed electrode portions 11 each include multiple fixed teeth 110, a fixed-tooth connecting portion 111 connecting the fixed teeth 110, and a lead portion 112. The fixed teeth 110 extend in the x-axis direction and are arranged in the y-axis direction at predetermined intervals. The fixed-tooth connecting portion 111 extends in the y-axis direction and connects the fixed teeth 110 arranged in the y-axis direction. The lead portion 112 extends in a direction perpendicular to the fixed-tooth connecting portion 111, that is, in the x-axis direction. The lead portion 112 has a rectangular terminal portion formed in a tip portion of the lead portion 112. On the upper surface of the terminal portion, a conductive metal such as aluminum is provided to form an electrode pad 113.

Although not shown, a gap is provided between the fixed-electrode outer periphery portion 35 and the lead portion 112 and fixed-tooth connecting portion 111 of each fixed electrode portion 11, thereby physically separating the fixed-electrode outer periphery portion 35 from the lead portion 112 and fixed-tooth connecting portion 111 of each fixed electrode portion 11. This provides electric insulation between the fixed-electrode outer periphery portion 35 and each fixed electrode portion 11. The lead portion 112 and fixed-tooth connecting portion 111 of each fixed electrode portion 11 are supported by the base 7 with the bonding layer 8 therebetween. The fixed teeth 110 of each fixed electrode portion 11 extend in a region corresponding to a rectangular opening 7a provided in the base 7 (see FIG. 1(B) and FIGS. 2(A) and (B)).

The movable electrode portion 12 includes multiple movable teeth 120, a center band portion 121 (see FIG. 1(B)), and movable-tooth connecting portions 122 connecting the movable teeth 120. The movable-tooth connecting portions 122 extend in the positive and negative y-axis directions, respectively, from the center in the x-axis direction of the center band portion 121. The movable teeth 120 extend in the positive or negative x-axis directions from the movable-tooth connecting portions 122 extending in the positive and negative y-axis directions, and are arranged in the y-axis direction at predetermined intervals.

Weights 105a and 105b are fixed, by means such as bonding, to the upper and bottom surfaces of the center band portion 121 of the movable electrode portion 12, which are surfaces on the positive and negative z-axis direction sides of the center band portion 121, respectively. The positions of the gravity centers of the weights 105a and 105b are coaxial with a z-axis that passes through the center in the x-axis and y-axis directions of the center band portion 121.

Two of the fixed electrode portions 11 on the positive y-axis direction side of the center band portion 121 are disposed in line symmetry with respect to the center line to the x-axis direction of the center band portion 121. The other two of the fixed electrode portions 11 on the negative y-axis direction side of the center band portion 121 are disposed in line symmetry with respect to the center line to the x-axis direction of the center band portion 121.

The fixed teeth 110 extending in the x-axis direction from the fixed-tooth connecting portions 111 and the movable teeth 120 extending in the x-axis direction from the movable-tooth connecting portions 122 are disposed such that the fixed teeth 110 and the movable teeth 120 mesh with each other, with gaps interposed therebetween in the y-axis direction.

The movable electrode portion 12 is mechanically and electrically connected, via the elastic supporting portions 13, to fixed portions 150 fixed to the base 7 via the bonding layer 8. The fixed portions 150 are provided respectively on the positive and negative x-axis direction sides of the center band portion 121, that is, in a pair. The pair of fixed portions 150 are formed into the same shape and disposed in line symmetry with respect to the central axis to the x-axis direction of the center band portion 121. The center line to the y-axis direction of each fixed portion 150 is coaxial with the center line to the y-axis direction of the center band portion 121.

The movable electrode portion 12 supported by the elastic supporting portions 13 is vibrated in the x-axis direction by external vibration, and one side surface 121a (see FIG. 3) of the center band portion 121 of the movable electrode portion 12 collides with one of the fixed portions 150. At this point, if the position in the y-axis direction of the contact portion of the fixed portion 150 with which the movable portion collides deviates in the y-axis direction from the central axis passing through the gravity center of the center band portion 121 including the weights 105a and 105b, a moment occurs in the center band portion 121 of the movable electrode portion 12. The moment occurring in the center band portion 121 of the movable electrode portion 12 deforms the elastic supporting portions 13, preventing the center band portion 121 to vibrate normally. It is therefore necessary for the center line to the y-axis direction of the contact portion of the fixed portion 150 with which the center band portion 121 of the movable electrode portion 12 collides to be coaxial with the center line of the center band portion 121 of the movable electrode portion 12 extending in the x-axis direction.

An electrode pad 114 is connected to each fixed portion 150. Each fixed portion 150 has a rectangular terminal portion formed integrally with the fixed portion 150. On the upper surface of the terminal portion, a conductive metal such as aluminum is provided to form the electrode pad 114.

The electrode pads 113 and 114 are connected, with wires 22, to respective electrodes 21a and 21b provided on the case 2.

The fixed electrode portions 11 and the movable electrode portion 12 have electrets formed therein. In a case where only either the fixed electrode portions 11 or the movable electrode portion 12 have/has electrets formed therein, an electric charge of the reversed polarity is produced in the other. Therefore, only either the fixed electrode portions 11 or the movable electrode portion 12 may have electrets formed therein.

In this embodiment, the movable electrode portion 12 is configured to vibrate in the x-axis direction. The vibration of the movable electrode portion 12 in the x-axis direction changes the degree of insertion of the movable teeth 120 of the movable electrode portion 12 into the gaps between the fixed teeth 110 of the fixed electrode portions 11. This causes movement of an electric charge, by which electric power is generated.

Figure 2:
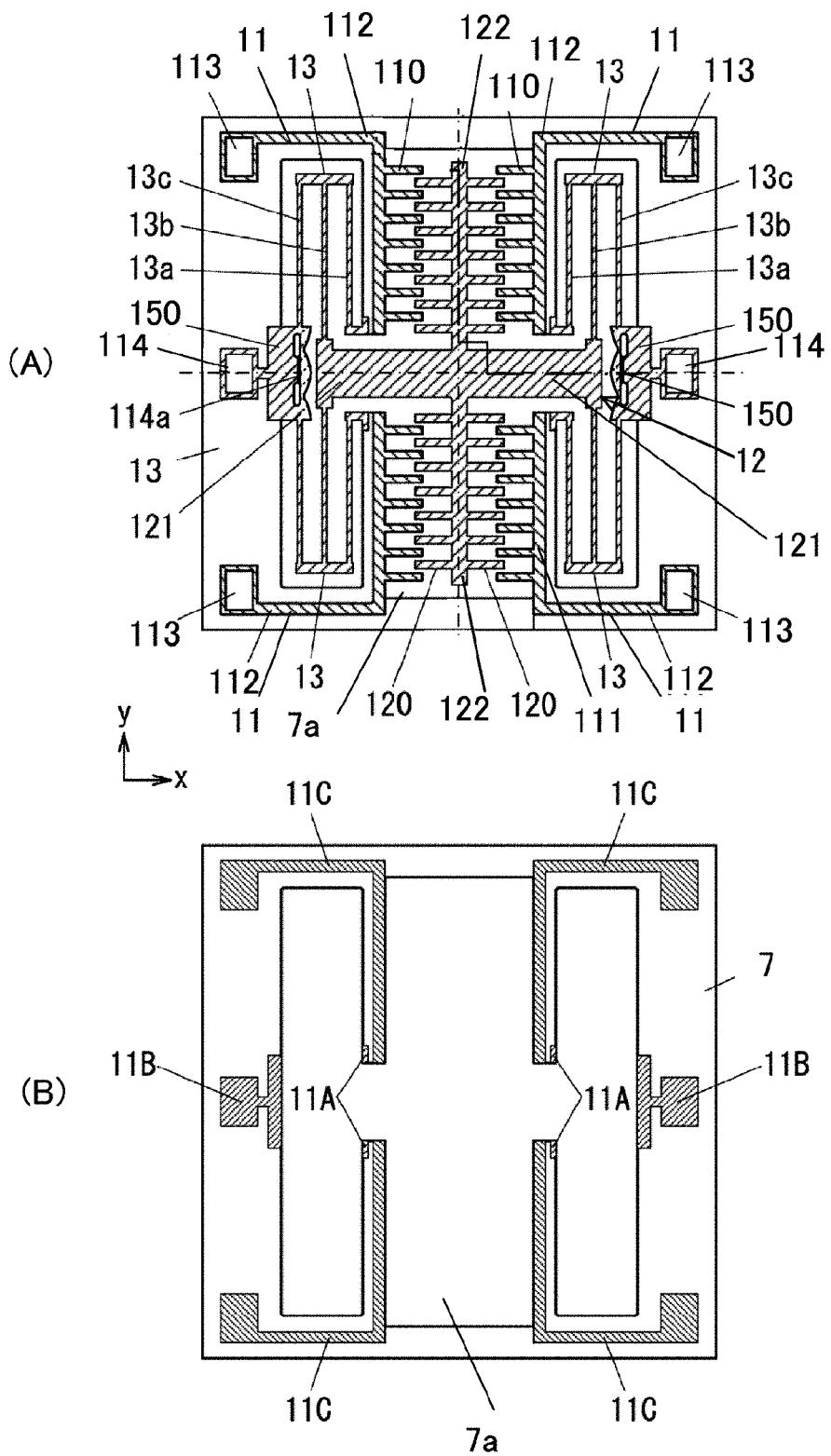
FIG. 2(A) is a plan view of the MEMS element illustrated in FIG. 1(A)
FIG. 2(B) is a plan view illustrating a state in which fixed electrode portions and a movable electrode portion are removed from the MEMS element illustrated in FIG. 2(A).

FIG. 2(A) is a diagram illustrating the MEMS element 10 before the weights 105a and 105b are fixed thereto.

As described above, the MEMS element 10 is produced from a silicon on insulator (SOI) substrate by a general MEMS process technique. The SOI substrate is configured to have a three-layer structure in which the base 7, the bonding layer 8, and the device layer 9 made of a Si active layer are stacked in the z-axis direction. As illustrated in FIG. 1(B), the device layer 9 is supported by the base 7 via the bonding layer 8. The fixed electrode portions 11, the movable electrode portion 12, and the elastic supporting portions 13 are formed of the Si active layer.

In FIG. 2(A), the fixed electrode portions 11, the movable electrode portion 12, the elastic supporting portions 13, and the fixed portions 150 on the base 7 are illustrated by hatching them. The movable electrode portion 12 is elastically supported by the four elastic supporting portions 13. The elastic supporting portions 13 each include three beams 13a to 13c that are elastically deformable. The movable electrode portion 12 is disposed in a region corresponding to the opening 7a provided in the base 7. The movable electrode portion 12 is connected to the fixed portions 150 via the beams 13a to 13c of the elastic supporting portions 13. The fixed portions 150 are fixed to the base 7 via the bonding layer 8. The movable electrode portion 12 is thus supported by the base 7 via the four elastic supporting portions 13 and the fixed portions 150.

The fixed portions 150 also function as restricting portions that restrict the vibration range in the x-axis direction of the movable electrode portion 12. As illustrated in FIG. 3(A), the fixed portions 150 each include a fixed portion body 151, an elastic portion 152, and a slit 153 provided between the fixed portion body 151 and the elastic portion 152.

Vibrations of the movable electrode portion 12 in the x-axis direction are regulated by collision of the movable electrode portion 12 with the fixed portions 150 and resultant deformation of the elastic portions 152. That is, forces of the movable electrode portion 12 act on the fixed portions 150. The fixed portions 150 need to have rigidity for receiving the forces of the movable electrode portion 12 without being damaged. Employing the fixed portions 150 in this embodiment provides a structure capable of preventing damages from strong acceleration acting on the MEMS element 10 in the x-axis direction, as well as capable of downsizing, compared with conventional structures. This will be described later.

FIG. 2(B) is a plan view illustrating a state in which the fixed electrode portions 11 and the movable electrode portion 12 are removed from the MEMS element 10 illustrated in FIG. 2(A). Hatched zones 11C in FIG. 2(B) illustrate a pattern of bonding portions in which the fixed-tooth connecting portions 111 and the lead portions 112 of the fixed electrode portions 11 are bonded to the bonding layer 8. Hatched zones 11A in FIG. 3(B) illustrate a pattern of bonding portions in which end portions of the beams 13a of the elastic supporting portions 13 are bonded to the bonding layer 8. Hatched zones 11B in FIG. 3(B) illustrate a pattern of bonding portions in which the fixed portions 150 are bonded to the bonding layer 8.

FIG. 3(A) is an enlarged view of a region $III_A$ in FIG. 1(A), and FIG. 3(B) is an enlarged view of a region $III_B$ in FIG. 3(A). Each fixed portion 150 includes the fixed portion body 151, the elastic portion 152, and the slit 153 provided between the fixed portion body 151 and the elastic portion 152. The central axis to the y-axis direction of the fixed portion 150 is coaxial with the central axis to the y-axis direction of the center band portion 121 of the movable electrode portion 12.

The elastic portion 152 extends along the one side surface 121a to the x-axis direction of the center band portion 121. The elastic portion 152 includes four beam sections 152a to 152d, and two beam-section connecting portions 154, respectively connecting the beam sections 152a and 152b and the beam sections 152c and 152d.

FIG. 4(A) is a principle diagram describing the surface shape of the elastic portion 152 and illustrates an elastic portion 251 formed of a parabolic beam 252, which is a double-clamped beam having four beam sections 252a to 252d. The four beam sections 252a each have a parabolic shape and form a pseudo beam of uniform strength that provides substantially uniform stress distribution across the entire length of the double-clamped beam.

The vertex of the parabola of the beam section 252a is connected by a beam-section connecting portion 254 with the vertex of the parabola of the beam section 252b. The vertex of the parabola of the beam section 252c is connected by another beam-section connecting portion 254 with the vertex of the parabola of the beam section 252d.

Figure 3:
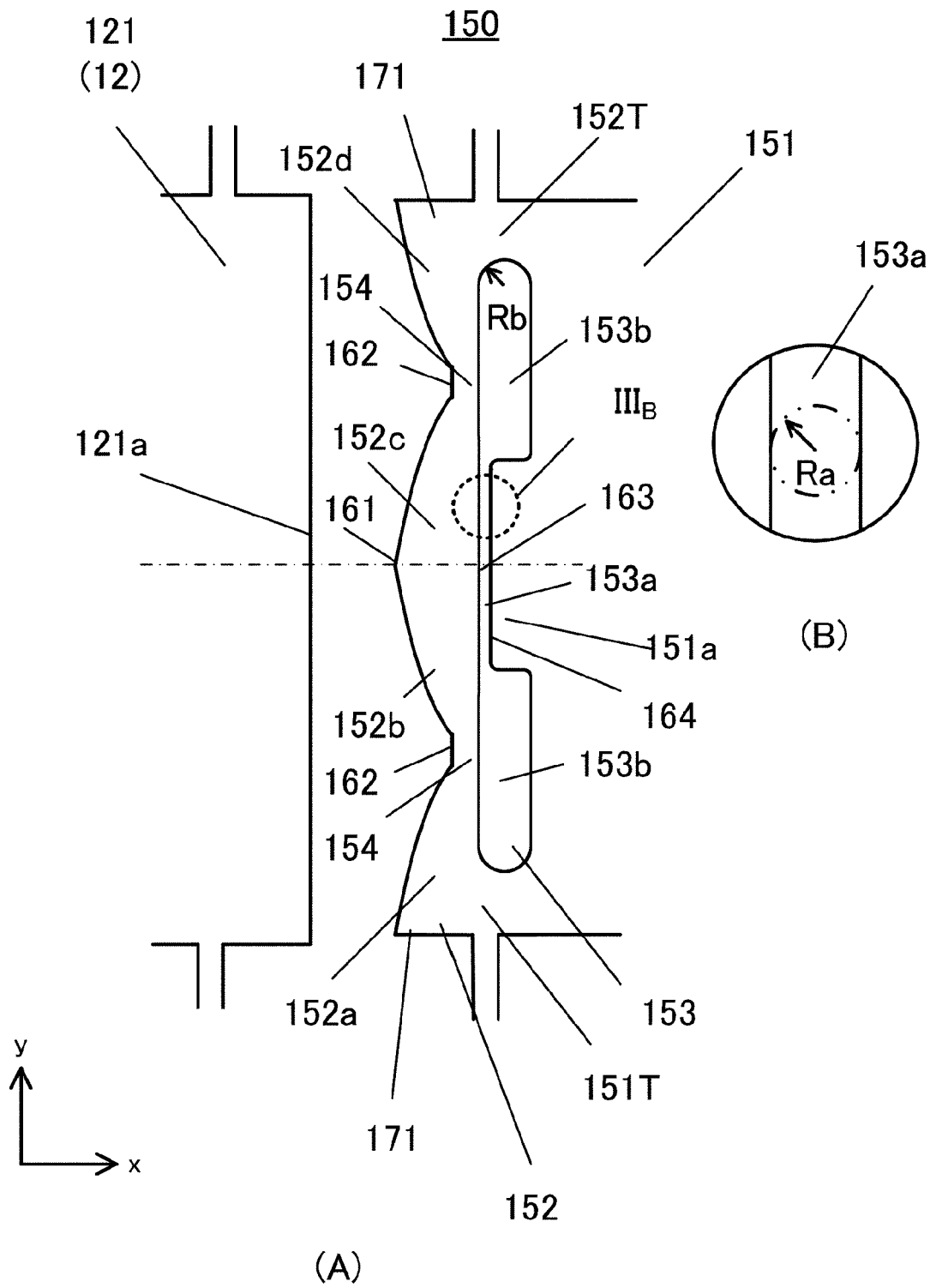
FIG. 3(A) is an enlarged view of a region $III_A$ in FIG. 1(A)
FIG. 3(B) is an enlarged view of a region $III_B$ in FIG. 3(A).

The elastic portion 152 in FIG. 3 is a pseudo beam of uniform strength having the four beam sections 152a to 152d. This pseudo beam of uniform strength is a beam resulting from modifying the shape of the parabolic beam 252 in FIG. 4 by flattening the side surface on the right of the axis of the parabolas of the beam sections 252a to 252d.

The beam structure in FIG. 4 will be described in detail later.

Returning to FIG. 3, description will be continued. The surface of the elastic portion 152 facing the center band portion 121 has a substantially parabolic contour similar to the contour of each of the beam sections 252a to 252d in FIG. 4. The beam sections 152a and 152b and the beam sections 152c and 152d are connected by the beam-section connecting portions 154 on the vertex sides of the parabolas. The beam sections 152b and 152c are connected on the opposite sides of the vertices of the parabolas. Hereafter, the opposite side of the vertex of a parabola will be referred to as a basal side. The beam sections 152a and 152d are integrated into one end 151T and the other end 152T in the y-axis direction of the fixed portion body 151, respectively, so that the elastic portion 152 functions as a double-clamped beam.

In the end portion of the fixed portion body 151 with which the center band portion 121 of the movable electrode portion 12 collides, the slit 153 extends in the y-axis direction in parallel with the one side surface 121a of the center band portion 121. Forming the slit 153 creates the elastic portion 152 serving as a double-clamped beam.

The slit 153 includes a first slit portion 153a formed in a central portion in the y-axis direction, or in other words, in a region corresponding to the beam sections 152b and 152c. The slit 153 also includes second slit portions 153b formed in both end portions in the y-axis direction, that is, in regions corresponding to the beam-section connecting portions 154. The two second slit portions 153b are substantially the same in shape and size. The width in the x-axis direction of the first slit portion 153a defines the maximum amount of movement in the x-axis direction of the elastic portion 152. The first slit portion 153a is formed between a side surface of the beam sections 152b and 152c facing the slit 153 and an ultimate regulating tip surface 164 of a protruding portion 151a inside the slit 153. The width, or in other words, the length in the x-axis direction, of the first slit portion 153a is smaller than the width in the x-axis direction of the second slit portions 153b.

The second slit portions 153b are formed in a semicircular shape in regions near corner portions 171 of the fixed portion body 151.

The center in the y-axis direction of the connecting portion between the beam sections 152b and 152c is coaxial with the center in the y-axis direction of the center band portion 121. A side surface 161 of the connecting portion between the beam sections 152b and 152c protrudes to be closest in the elastic portion 152 to the one side surface 121a of the center band portion 121. Side surfaces 162 of the two beam-section connecting portions 154 are farthest in the elastic portion 152 from the one side surface 121a of the center band portion 121. Thus, the thickness, or the length in the x-axis direction, of the beam-section connecting portions 154 is smaller than that of the connecting portion between the beam sections 152b and 152c.

That is, the elastic portion 152 has a structure including the central portion, the one end, and the other end that are thicker, and thin portions thinner than the central portion, respectively between the central portion and the one end and between the central portion and the other end.

Now, operations of restricting the vibration range of the movable electrode portion 12 by the fixed portion 150 will be described.

When the movable electrode portion 12 vibrates to move the center band portion 121 in the x-axis direction, the one side surface 121a of the center band portion 121 collides with the side surface 161 of the connecting portion in the elastic portion 152 of the fixed portion 150. The elastic portion 152 of the fixed portion 150 is pressed and deformed by the one side surface 121a of the center band portion 121. An inner side surface 163 of the elastic portion 152 facing the first slit portion 153a then contacts the ultimate regulating tip surface 164 of the protruding portion 151a of the fixed portion body 151 facing the first slit portion 153a. At this position, the center band portion 121 stops its movement in the x-axis direction. The ultimate regulating tip surface 164 of the fixed portion body 151 thus serves as a restricting portion that restricts the vibration range of the center band portion 121, that is, the movable electrode portion 12.

Upon collision of the elastic portion 152 with the ultimate regulating tip surface 164, the movable electrode portion 12 stops. In a conventional structure, the slit may have a width that corresponds to the maximum amount of movement of the movable electrode portion 12 and that is set to be constant across the entire length in the y-axis direction of the elastic portion, and the elastic portion may have a uniform rectangular cross section across the entire length in the y-axis direction. In such a conventional structure, stress would concentrate around the corner portions 171 of the elastic portion 152 near both ends in the y-axis direction of the slit 153. This would increase the likelihood of a damage to the corner portions 171 in both end portions in the y-axis direction of the elastic portion 152.

As a comparative example, consider the structure of an elastic portion in which the slit 153 formed in the fixed portion 150 has only the first slit portion 153a, which extends to both end portions in the y-axis direction of the fixed portion body 151, and the elastic portion has a uniform rectangular cross section across the entire length of the beam. In this structure in the comparative example, the radius of curvature of semicircles formed at both ends in the y-axis direction of the first slit portion 153a near the corner portions 171 of the fixed portion body 151 is a radius Ra of a circle inscribed in the first slit portion 153a, as illustrated in FIG. 3(B).

By contrast, the elastic portion 152 in this embodiment is a pseudo beam of uniform strength that has a greater flexural rigidity, or in other words, a greater spring constant, than the beam in the comparative example, and that allows stress to be substantially uniform across the entire length of the beam. Therefore, the magnitude of elastic energy (energy of absorbing an impact) of the elastic portion 152 of the beam in this embodiment is greater than that of the beam in the comparative example. This embodiment also has the second slit portions 153b wider than the first slit portion 153a on both sides in the y-axis direction of the first slit portion 153a. The second slit portions 153b formed near the corner portions at both ends in the y-axis direction of the fixed portion body 151 can have the radius of curvature Rb greater than the radius of curvature Ra of the first slit portion 153a. This can reduce stress concentrating on the corner portions at both ends in the y-axis direction of the fixed portion body 151.

The first slit portion 153a may have a width of approximately 10 to 20 μm, for example. The second slit portions 153b may have a width equal to or greater than 50 μm, for example. These widths are mere examples for reference purposes, and any optimal width may be employed as appropriate.

The side surface of the elastic portion 152 illustrated in FIG. 3 is formed to be gently curved from the side surface 161 of the central portion in the y-axis direction toward the side surfaces 162 of the beam-section connecting portions 154. This allows substantially uniform stress distribution between the side surface 161 of the basal-side connecting portion and each of the side surfaces 162 of the beam-section connecting portions 154.

Further, because the fixed portion 150 illustrated in FIG. 3 has the second slit portions 153b provided on both sides in the y-axis direction of the first slit portion 153a, the length in the y-axis direction of the first slit portion 153a, or in other words, the length of the ultimate regulating tip surface 164, is reduced. This can improve the discharge performance of reactive gas, as will be described below.

The slit 153 is typically formed by deep reactive ion etching (DRIE).

What is important in DRIE etching for improving the rate of reaction with Si, which is a material to be etched, is good discharge performance of reactive gas flowing from the slit after reaction. If the slit processed by etching is narrow and elongated, the discharge performance of the reactive gas flowing from the slit is degraded to increase the process time. In this embodiment, the first slit portion 153a is short in the y-axis direction, or in other words, in the direction perpendicular to the slit width direction. This can improve the discharge performance of the reactive gas from the slit after reaction, leading to more efficient processing of the slit 153 in a shorter time.

Figure 6:
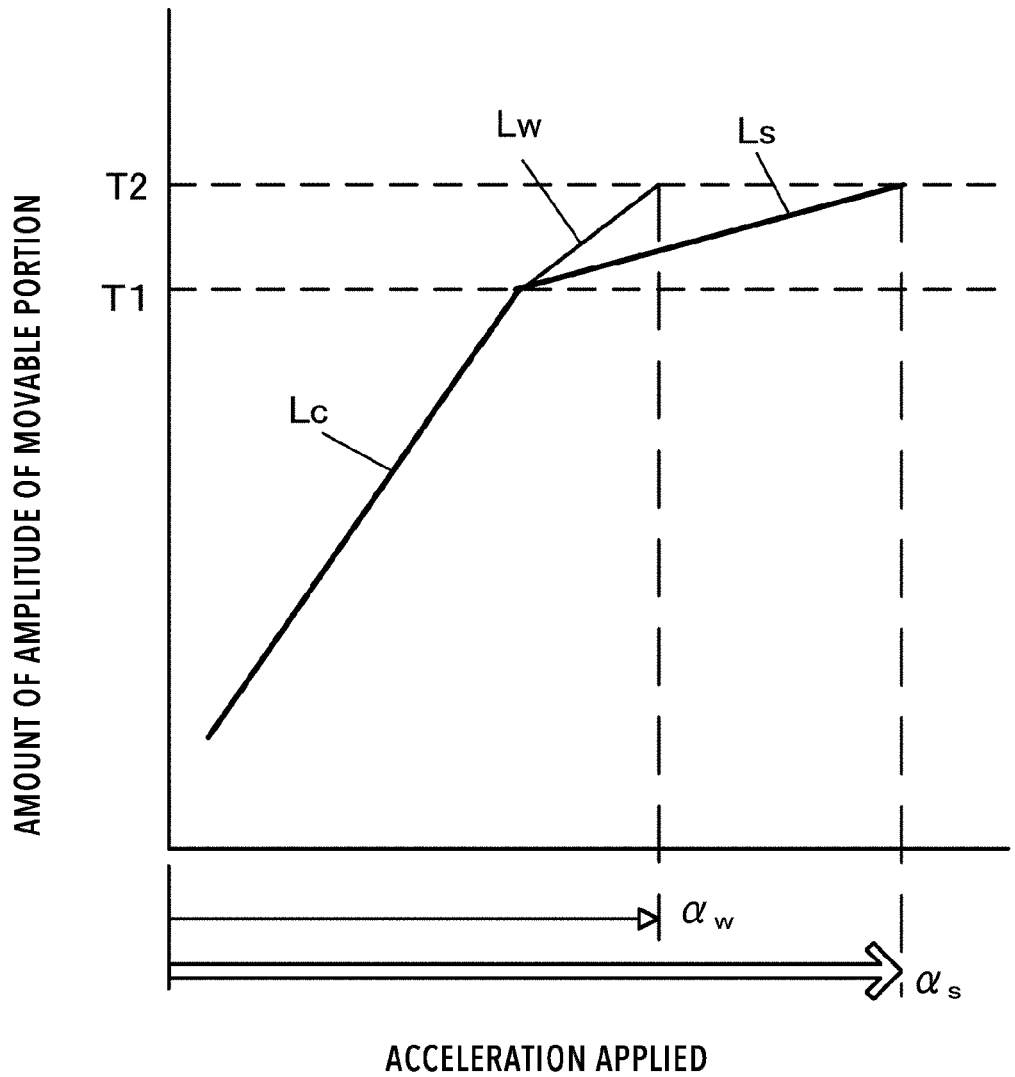
FIG. 6 is a diagram illustrating relationships between the amount of amplitude of a movable portion and acceleration applied to the vibration-driven energy-harvesting device in a comparative example and an embodiment.

FIG. 6 is a diagram illustrating relationships between the amount of amplitude of the movable portion and acceleration applied to the vibration-driven energy-harvesting device 1 in the comparative example and this embodiment.

In FIG. 6, the ordinate indicates the amount of amplitude of the movable portion, and the abscissa indicates acceleration applied to the vibration-driven energy-harvesting device 1. A point T1 on the ordinate indicates the position where the one side surface 121a of the center band portion 121 contacts the side surface 161 of the elastic portion 152 of the fixed portion 150. A point T2 on the ordinate indicates the position where the inner side surface 163 of the elastic portion 152 hits the ultimate regulating tip surface 164 of the fixed portion body 151. While the elastic portion 152 moves from the position T1 to the position T2 and deforms, the elastic portion 152 absorbs impact energy acting on the MEMS element 10.

Once the movable electrode portion 12 starts vibrating, the one side surface 121a of the center band portion 121 reaches the point T1. Up to this point, the same relationship is observed between the amount of amplitude of the movable portion and the acceleration applied to the vibration-driven energy-harvesting device 1 as indicated by a straight line Lc, irrespective of whether the elastic portion 152 has a small spring constant or a great spring constant.

If the elastic portion 152 provided in the fixed portion 150 has a small spring constant, the one side surface 121a of the center band portion 121 reaches the point T2 with a small gradient of amplitude increase of the movable electrode portion 12 during the movement of the movable electrode portion 12, as indicated by a straight line $L_w$. That is, if the elastic portion 152 has a small spring constant, a small acceleration $\alpha_w$ is applied to the vibration-driven energy-harvesting device 1 when the one side surface 121a of the center band portion 121 reaches the point T2. By contrast, if the elastic portion 152 provided in the fixed portion 150 has a great spring constant, the force of the movable electrode portion 12 is continuously received after the acceleration applied to the vibration-driven energy-harvesting device 1 exceeds the acceleration $\alpha_w$ during the movement of the movable electrode portion 12, as indicated by a straight line $_s$. When the acceleration reaches a certain magnitude $\alpha_s$, the point T2 is reached. That is, if the elastic portion 152 has a great spring constant, the acceleration $\alpha_s$ greater than the acceleration $\alpha_w$ is applied to the vibration-driven energy-harvesting device 1 when the one side surface 121a of the center band portion 121 reaches the point T2.

Thus, increasing the spring constant of the elastic portion 152 of the fixed portion 150 allows an increase in the energy absorbed during the period in which the elastic portion 152 deforms by the distance T2–T1 after collision of the movable electrode portion 12 with the fixed portion 150. This can prevent damages to the MEMS element 10 due to greater acceleration acting on the MEMS element 10 than in the comparative example. The absorbed energy will be described later.

In this embodiment, the slit 153 formed in the fixed portion 150 is configured with the first slit portion 153a with a smaller slit width for regulating the movement of the movable electrode portion 12, and the second slit portions 153b with a greater slit width connected to the first slit portion 153a and extending to positions near the corner portions 171 of the fixed portion 150. The regions of the second slit portions 153b closer to the corner portions 171 are formed in an arc shape with a greater radius of curvature. The side surface of the elastic portion 152 facing the center band portion 121 is gently curved from the side surface 161 of the central portion in the y-axis direction toward the side surfaces 162 of the beam-section connecting portions 154.

If increased external acceleration acts on the MEMS element 10, the above configuration still allows uniform stress to occur across the corner portions 171 in which the elastic portion 152 is fixed to the fixed portion body 151, and the region from the side surface 161 to the side surfaces 162 of the beam-section connecting portions 154 of the elastic portion 152. This can provide the elastic portion having a great spring constant while reducing the size of the elastic portion 152.

The elastic portion 152 of the fixed portion 150 has a beam structure allowing stress to be substantially uniform across the entire length of the beam, unlike the rectangular beam structure with a uniform cross section as in the comparative example. The elastic portion 152 also has a great spring constant compared with the beam in the comparative example. That is, the elastic portion 152 has a spring constant greater than that of the beam in the comparative example. Thus, as described with reference to FIG. 6, if the slit width of the first slit portion 153a is the same as that in the comparative example, or in other words, if the movable range of the movable electrode portion is the same as that in the comparative example, damages to the elastic portion 152 can still be prevented when the MEMS element 10 is dropped off or when some other member collides with the MEMS element 10 during installation of the MEMS element 10.

Stress distribution in the comparative example and the embodiment will be described with reference to FIG. 7.

FIG. 7(A) is a perspective view illustrating simulated stress distribution occurring in an elastic portion 301, which is a double-clamped beam with a uniform rectangular cross section across the entire length, when a concentrated load f is applied to the center in the y-axis direction of the elastic portion 301. The elastic portion 301 is formed of Si. Note that the elastic portion 301 is a beam equivalent to the elastic portion in the above-described comparative example.

Figure 4:
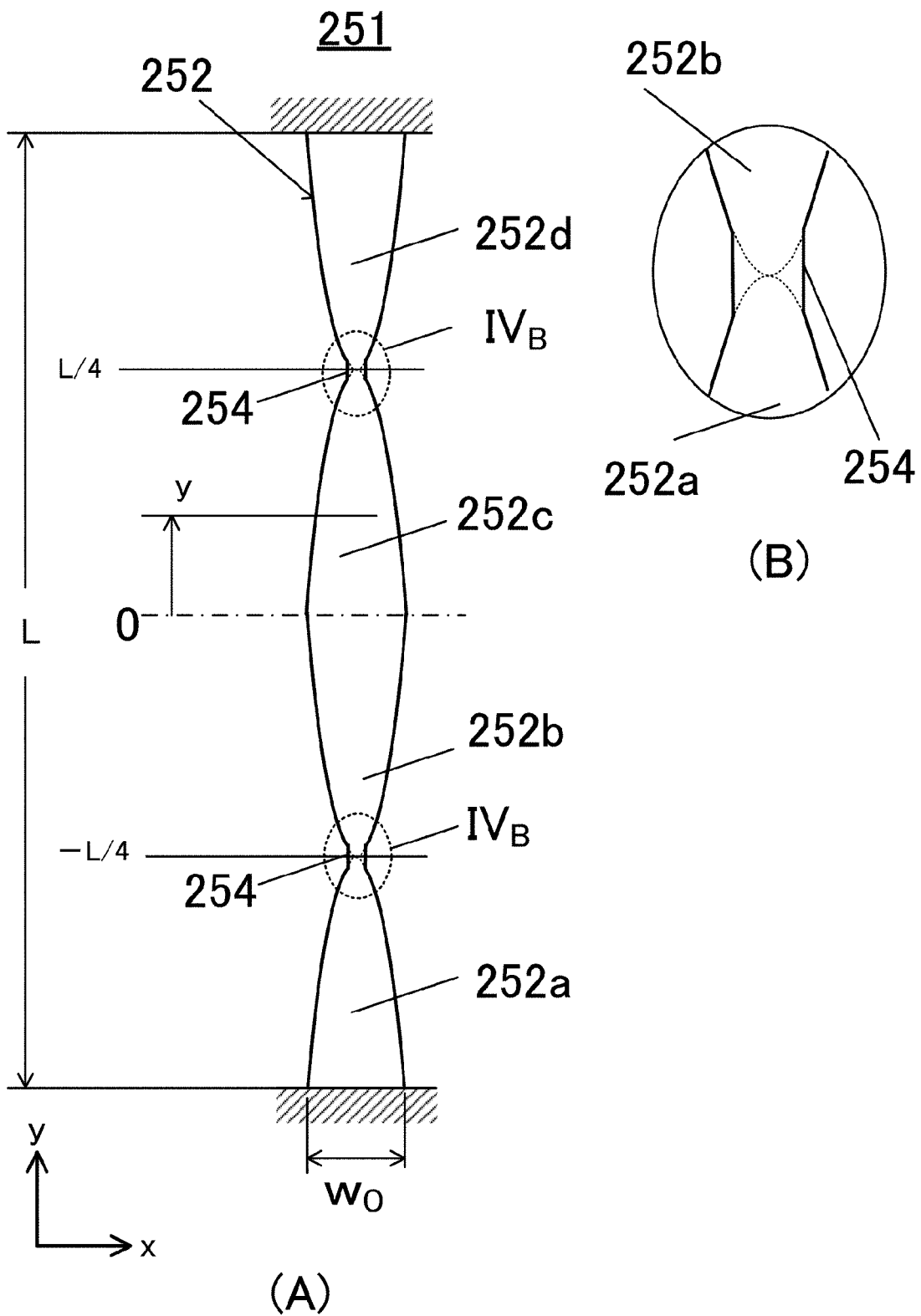

FIG. 7(B) is a perspective view of a beam equivalent to the beam according to the principle diagram in FIG. 4 describing the parabolic beam 252 having the four beam sections 252a to 252d in the embodiment.

In FIGS. 7(A) and (B), hatching A represents great stress, hatching C represents small stress, and hatching B represents middle stress.

As illustrated in FIG. 7(A), great stress occurs on the surfaces of the side surfaces to the positive and negative x-axis directions in a middle portion 301m in the y-axis direction of the elastic portion 301. Great stress also occurs on the surfaces of the side surfaces to the positive and negative x-axis directions at one end 301ta and the other end 301tb in the y-axis direction of the elastic portion 301.

On the other hand, small stress occurs on the surfaces between the middle portion 301m in the y-axis direction and the one end 301ta in the y-axis direction of the elastic portion 301, and on the surfaces between the middle portion 301m in the y-axis direction and the other end 301tb in the y-axis direction of the elastic portion 301.

From the above, it can be seen that the rectangular beam still has room for reducing the rigidity in the small-stress regions between the middle portion 301m in the y-axis direction and the one end 301ta and the other end 301tb in the y-axis direction.

Here, the pseudo beam of uniform strength in FIG. 4 will be described in detail.

FIG. 4(A) is a side view illustrating the shape of the elastic portion allowing stress to be substantially uniform across the entire length of the surfaces of side surfaces. FIG. 4(B) is an enlarged view of a region $IV_B$ in FIG. 4(A).

The parabolic beam 252 includes the first to fourth beam sections 252a to 252d, and the two beam-section connecting portions 254 respectively connecting the first and second beam sections 252a and 252b and the third and fourth beam sections 252c and 252d. The four beam sections, that is, the first to fourth beam sections 252a to 252d, each have a substantially parabolic contour.

As illustrated in FIG. 4(B), the first and second beam sections 252a and 252b and the third and fourth beam sections 252c and 252d are connected by the beam-section connecting portions 254 on the vertex sides of the parabolas. The vertices and regions around the vertices of the first and the second beam sections 252a and 252b are integrated together to form one of the beam-section connecting portions 254 in which the vertices contact each other. Similarly, the vertices and regions around the vertices of the third and fourth beam sections 252c and 252d are integrated together to form the other beam-section connecting portion 254 in which the vertices contact each other.

The second and third beam sections 252b and 252c are integrated together on the basal sides of the parabolas. The basal sides of the first and fourth beam sections 252a and 252d are fixed.

The both-ends-fixed beam connecting the four substantially parabolic beams illustrated in FIG. 4 will hereafter be referred to as a parabolic beam. The elastic portion 152 in FIG. 3, having a beam structure resulting from flattening the side surface on the right of the axis of the parabolas in FIG. 4, will also be referred to as a parabolic beam.

Forming the elastic portion 152 as a parabolic beam can make the spring constant greater than that of the rectangular beam in the comparative example and FIG. 7(A) having a uniform rectangular cross section across the entire length. This allows increasing the elastic energy that can be held by the elastic portion 152.

Figure 7:
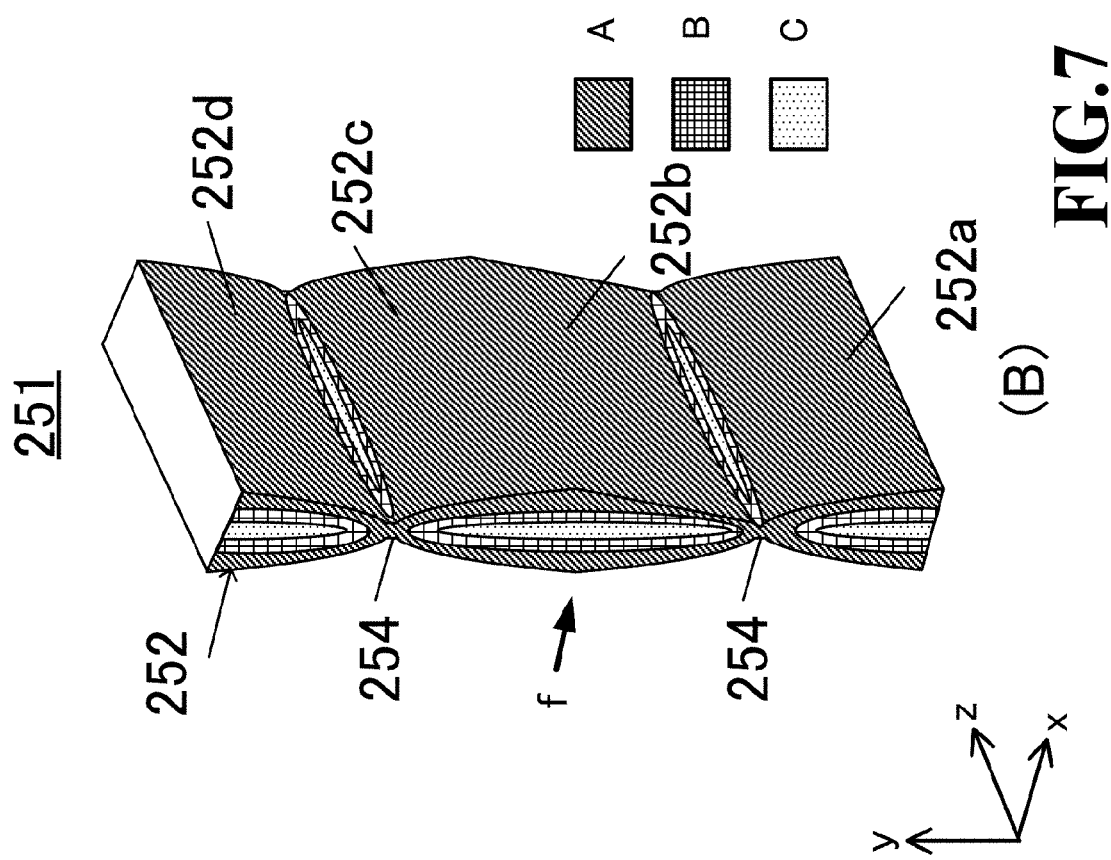
Figure 7:
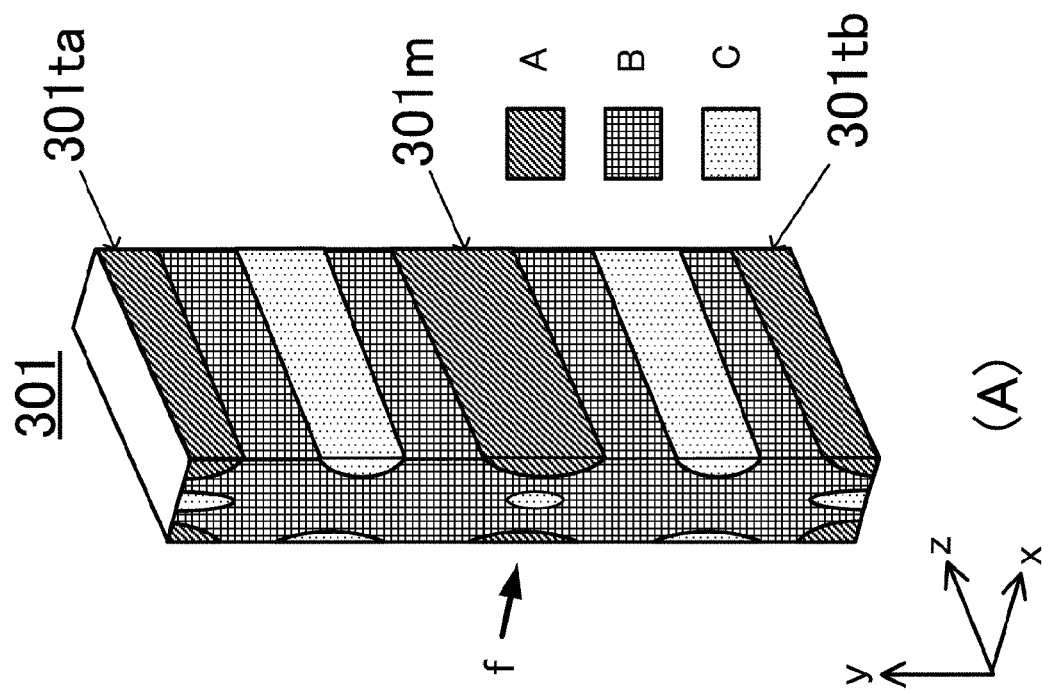

FIG. 7 is a perspective view illustrating simulated stress distribution occurring in the elastic portions, in which FIG. 7(A) is for the structure in the comparative example and FIG. 7(B) is for the structure in this embodiment.

FIG. 7(A) illustrates, as the comparative example, stress distribution in the rectangular elastic portion 301 having a uniform cross section.

As described above, in the comparative example, great stress occurs on the surfaces of the side surfaces to the positive and negative x-axis directions in the middle portion 301m, the one end 301ta, and the other end 301tb in the y-axis direction of the elastic portion 301. Small stress occurs on the surfaces of the side surfaces between the middle portion 301m in the y-axis direction and the one end 301ta in the y-axis direction of the elastic portion 301, and on the surfaces of the side surfaces between the middle portion 301m in the y-axis direction and the other end 301tb in the y-axis direction of the elastic portion 301. Thus, the magnitude of the stress occurring in the elastic portion 301 is not uniform but varies across the entire length.

FIG. 7(B) illustrates stress distribution of the elastic portion 251 formed of a parabolic beam bended so that the maximum stress occurring in the elastic portion 251 equals the maximum stress in the comparative example in FIG. 7(A).

For the elastic portion 251 formed of the parabolic beam 252 illustrated in FIG. 7(B), it was found that relatively great stress occurs on the surfaces of the side surfaces to the positive and negative x-axis directions of the first to fourth beam sections 252a to 252d except the beam-section connecting portions 254, and that the stress is substantially uniform across the surfaces of the side surfaces of the first to fourth beam sections 252a to 252d.

The maximum amount of deflection was approximately 0.5 μm in the elastic portion 301 in the comparative example, and approximately 1.0 μm in the elastic portion 251 formed of the parabolic beam 252.

The above structure allowing substantially uniform stress to occur across the first to fourth beam sections 252a to 252d enables increasing the spring constant, thereby increasing the elastic energy that can be held by the elastic portion 251. The reason for this will be described below.

First, for comparison with the effects of this embodiment, a rectangular beam with a uniform cross section will be described.

Figure 8:
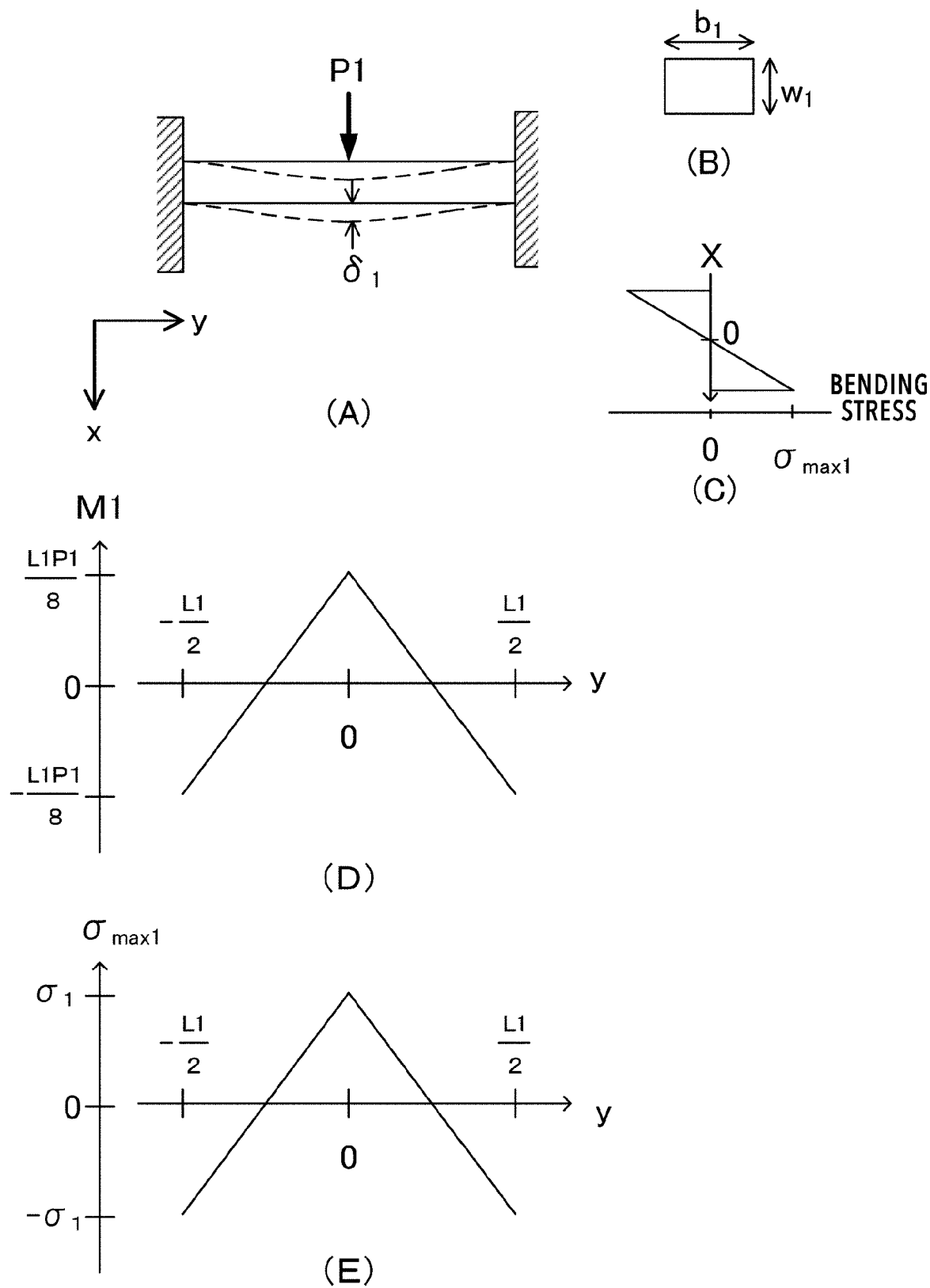
FIG. 8(A) is a schematic diagram of a both-ends-fixed rectangular beam (hereafter simply referred to as a rectangular beam)
FIG. 8(B) illustrates the shape of a cross section for FIG. 8(A)
FIG. 8(C) is a bending-stress distribution diagram for FIG. 8(A)
FIG. 8(D) is a bending moment diagram for FIG. 8(A)
FIG. 8(E) illustrates bending stress on the surface of a bottom surface to the x-axis direction of the beam illustrated in FIG. 8(A).

FIG. 8(A) is a schematic diagram of a both-ends-fixed rectangular beam (hereafter simply referred to as a rectangular beam). FIG. 8(B) illustrates the shape of a cross section for FIG. 8(A). FIG. 8(C) is a bending-stress distribution diagram for FIG. 8(A). FIG. 8(D) is a bending moment diagram for FIG. 8(A). FIG. 8(E) illustrates bending stress on the surface of the bottom surface to the x-axis direction of the beam illustrated in FIG. 8(A).

In the following, the thickness is the length in the x-axis direction, or in other words, the length in the bending direction, of the beam; the beam length is the length in the direction in which the beam extends; and the width is the length in the z-axis direction of the beam perpendicular to the x-axis and y-axis directions.

The rectangular beam has a uniform rectangular cross section of the thickness $w_1$ and the width $b_1$ across the entire beam length. That is, the thickness $w_1$ and the width $b_1$ of the beam are constant at any position in the beam length direction. Both ends of the beam are fixed, and the center of the beam length receives a concentrated load P1. The position where the concentrated load P1 is received is the origin 0, and y is the length from the origin. $L_1$ is the beam length. Therefore, the positions y of the one end and the other end of the beam are $\pm L_1/2$, respectively.

The bending moment $M_1(y)$, and the bending stress $\sigma_{max1}(y)$ on the surface of the bottom surface to the x-axis direction, at the position y, are expressed as equations (1) and (2), respectively.

$$M_1(y)=L_1P_1(1-4|y|/L_1)/8 \tag{1}$$

$$\sigma_{max1}(Y)=M_1(Y)/Z_1 \tag{2}$$

$Z_1$ is a section modulus and expressed as an equation (3).

$$Z_1=b_1w_1^2/6 \tag{3}$$

Because the rectangular beam has a constant section modulus $Z_1$ irrespective of y, $\sigma_{max1}(y)$ is proportional to $M_1(y)$. Therefore, at the positions where $|M_1(y)|$ is maximum (y=0 and y=$\pm L_1/2$) illustrated in FIG. 8(D), $|\sigma_{max1}(y)|$ takes the maximum $\sigma_1$ (see FIG. 8(E)).

That is, an equation (4) holds.

$$\sigma_1=\sigma_{max1}(0)=3L_1P_1/4b_1w_1^2 \tag{4}$$

Thus, stress concentrates at y=0 and y=$\pm L_1/2$, and increasing the concentrated load P1 will cause the stress in regions corresponding to these positions to exceed an allowable stress, leading to a collapse of the beam. At this point, regions other than these regions can still tolerate the stress. Improving the nonuniform stress in the rectangular beam to make the stress uniform enables effective use of the entire beam. This has been described with reference to the comparative beam illustrated in FIG. 7(A).

The flexure $\delta_1$ is expressed as an equation (5) using the bending moment and a second moment of area, $$\delta_1=L_1^3P_1/16Eb_1w_1^3 \tag{5}$$

where E is the Young's modulus.

Next, a parabolic beam will be described.

Figure 9:
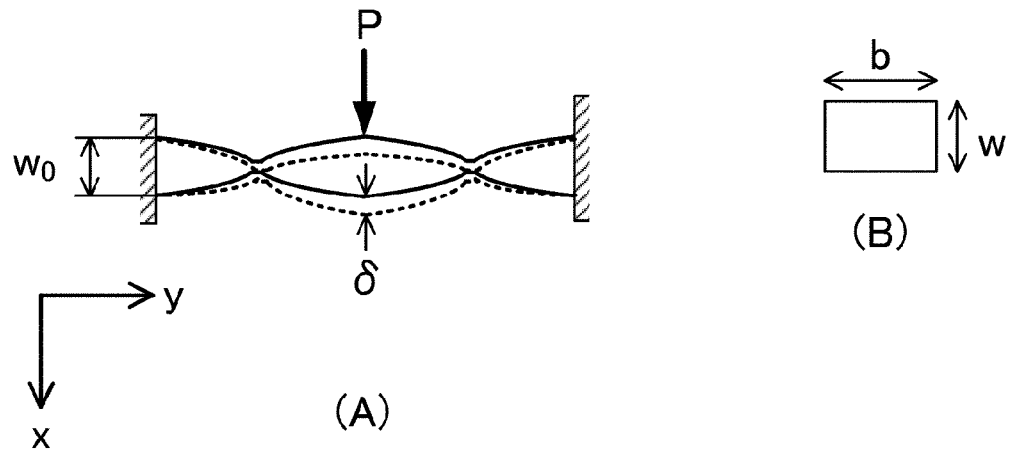
FIG. 9(A) is a schematic diagram of a both-ends-fixed parabolic beam.
FIG. 9(B) illustrates the shape of a cross section for FIG. 9(A)
FIG. 9(C) is a bending moment diagram for FIG. 9(A)
FIG. 9(D) illustrates bending stress on the surface of a bottom surface to the x-axis direction of the beam illustrated in FIG. 9(A).
Figure 9:
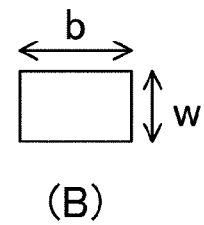
Figure 9:
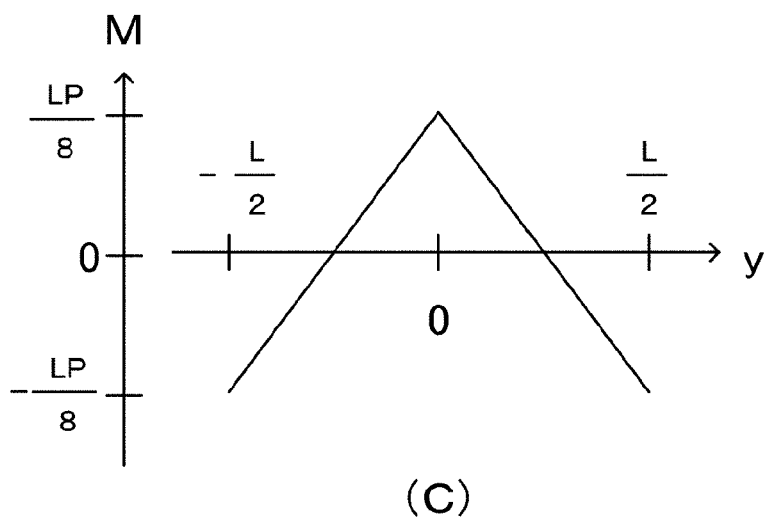
Figure 9:
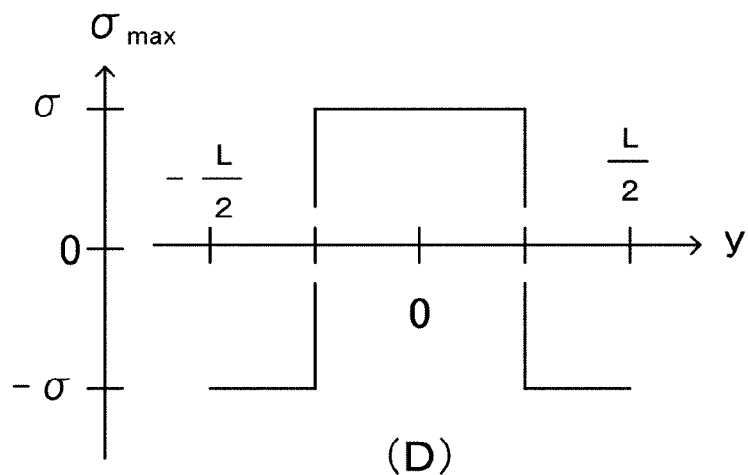

FIG. 9(A) is a schematic diagram of a both-ends-fixed parabolic beam. FIG. 9(B) illustrates the shape of a cross section for FIG. 9(A). FIG. 9(C) is a bending moment diagram for FIG. 9(A). FIG. 9(D) illustrates bending stress on the surface of the bottom surface to the x-axis direction of the beam illustrated in FIG. 9(A).

In the parabolic beam, the width b of the cross section is constant at any position in the beam length direction, but the thickness w is a function of y. w(y) is the thickness at a position y in the beam length direction. Both ends of the beam are fixed, and the center of the beam length receives a concentrated load P. The position where the concentrated load P is received is the origin 0, and y is the length from the origin. L is the beam length.

$w_0$ is the thickness of the beam at the one end and the other end, at which the parabolic beam is fixed (see FIG. 9(A)).

The function w(y) has the following symmetries:
(i) symmetric with respect to y=0,
  that is, w(-y)=w(y), and
(ii) symmetric with respect to y=L/4 in the portion where 0≤y,
  that is, w(L/4-y)=w(L/4+y) (x≥0).

According to these symmetries, the bending moment M(y) and the bending stress $\sigma_{max}(y)$ on the surface of the bottom surface to the x-axis direction are expressed as equations (6) and (7), respectively.

$$M(y)=LP(1-4|y|/L)/8 \tag{6}$$

$$\sigma_{max}(y)=M(y)/Z_{(y)} \tag{7}$$

Z(y) is a section modulus and expressed as an equation (8).

$$Z(y)=bw(y)^2/6 \tag{8}$$

Appropriately selecting the function w(y) allows $|\sigma_{max}(y)|$ to be a constant value $\sigma$ irrespective of y.

$$|\sigma_{max}(y)|=\sigma \tag{9}$$

Substituting the equations (6), (7), and (8) into the equation (9) and refining yields an equation (10).

$$w(y)=\sqrt{3LP|1-4|y|/L|/4b\sigma} \tag{10}$$

From the beam thickness w(-L/2)=$w_0$ at the one end and the other end of the parabolic beam, the relationship between $\sigma$ and w0 is obtained as an equation (11).

$$\sigma=3LP/4bw_0^2 \tag{11}$$

According to the equation (11), the equation (10) is turned into an equation (10a).

$$w(y)=w_0\sqrt{|1-4|y|/L|} \tag{10a}$$

The absolute of the bending stress on the surface of the bottom surface to the x-axis direction is $\sigma$ irrespective of the position y, resulting in uniform distribution.

The flexure $\delta$, calculated from the bending moment and the second moment of area, is expressed as an equation (12).

$$\delta=L^3P/8Ebw_0^3 \tag{12}$$

The shape of the parabolic beam according to the equation (10a) is illustrated as in FIG. 4.

The beam length L, the position y, and the beam thickness $w_0$ at the one end and the other end illustrated in FIG. 4 correspond to L, y, and $w_0$ in the equation (10a), respectively.

At the length y=$\pm L/4$ from the center in the y-axis direction, the beam thickness is w(y)=0. However, such a beam cannot receive the concentrated load P. Regions including these positions are therefore connected by the connecting portions.

Now, effects provided by replacing the rectangular beam of the elastic portion 152 with the parabolic beam will be described. As a condition for replacement, dimensions other than the beam thickness w are assumed to be the same.

That is, the beam width $b_1$=b, and the beam length $L_1$=L.

$\delta_0$ is the flexure at the point when the maximum of the stress on the beam reaches the allowable stress co for the material, and both beams have the same conditions. That is, the flexure $\delta_1=\delta=\delta_0$, and the bending stress $\sigma_1=\sigma=\sigma_0$.

Thus, in the case to be considered here, the rectangular beam and the parabolic beam are both bent on the verge of corruption with the same amount of deflection. Here, an equation (13) holds according to the equations (4), (5), (11), and (12).

$$w_0/w_1=2L^2\delta_1/L_1^2\sigma_1\delta=2 \tag{13}$$

The equation (13) indicates that forming the elastic portion 152 as a parabolic beam allows the one end and the other end at which the elastic portion 152 is fixed to the fixed portion 150 to be twice as thick as those of the rectangular beam. This suggests the ability to increase the elastic energy that can be held by the elastic portion 152.

Here, the elastic energy that can be held by each of the rectangular beam and the parabolic beam will be determined as below.

The elastic energy $U_1$ and U held by the rectangular beam and the parabolic beam, respectively, when the beams are bent to their limit, are expressed as equations (14) and (15), respectively.

$$U_1=P_1\delta_1/2 \tag{14}$$

$$U=P\delta/2 \tag{15}$$

From the equations (4), (11), and (13), it can be seen that the relationship expressed as an equation (16) holds for the above magnitudes.

$$U/U_1 = P\delta/P_1\delta_1 = 4 \tag{16}$$

From the equation (16), it can be seen that replacing the rectangular beam with the parabolic beam of the same length can quadruple the elastic energy that can be held without collapse.

Thus, the elastic portion 152 employing the parabolic beam structure can effectively maintain its vibrating state against strong external vibrations.
(Variations of Parabolic Beam)

Figure 5:
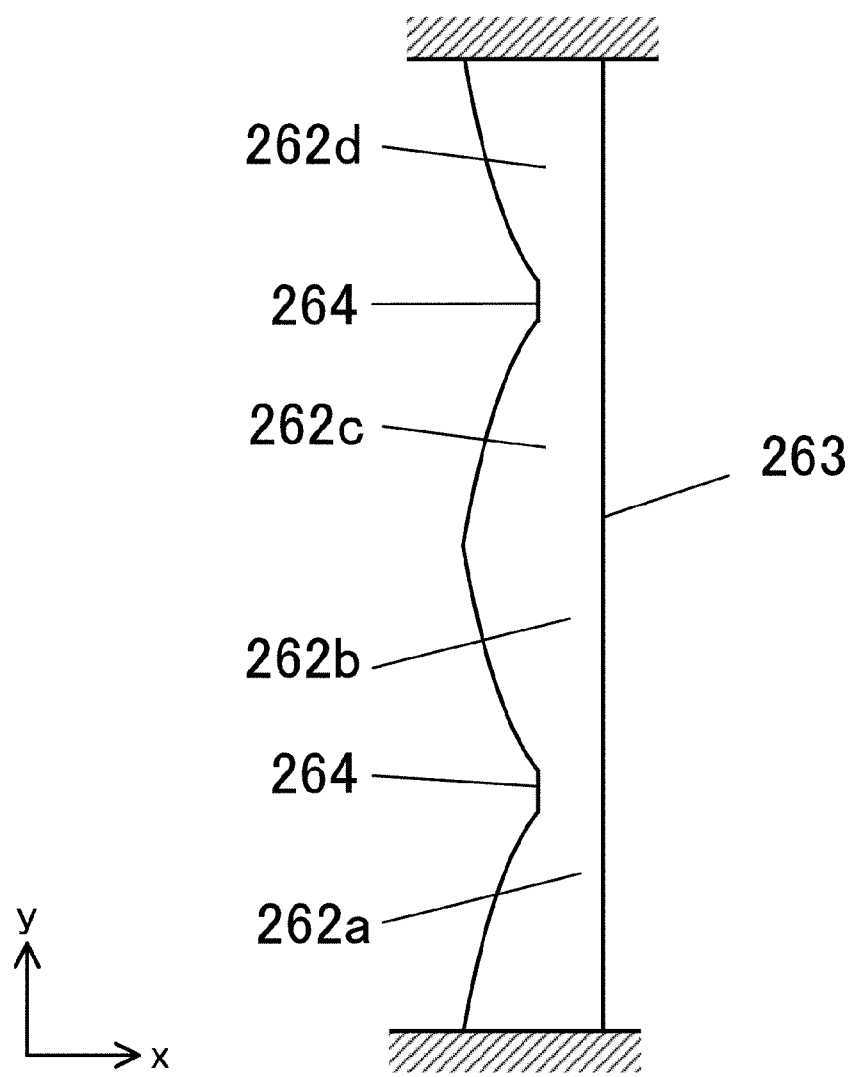
FIG. 5 is another principle diagram of the parabolic beam illustrated in FIG. 4, showing a side view of the beam.

FIG. 5, corresponding to FIG. 4 presented as a principle diagram, is a principle diagram of the pseudo beam of uniform strength in the embodiment illustrated in FIG. 3.

The parabolic beam 252 illustrated in FIG. 4 has a structure in which the four beam sections have contours in line symmetry with respect to the axis passing through the vertices in parallel with the y-axis direction.

An elastic portion 261 illustrated in FIG. 5 has a substantially parabolic beam structure in which one side surface extends straight and only the side surface opposite to the one side surface is curved.

In the elastic portion 261, a side surface 263 opposite to the side surface facing the center band portion 121 of the movable electrode portion 12 extends straight in the y-axis direction.

The elastic portion 261 includes four beam sections 262a to 262d connected in the manner as in the parabolic beam 252 in FIG. 4.

Specifically, the basal portions of the beam sections 262a and 262d are fixed. The basal portions of the beam sections 262b and 262c are integrated together at the center in the y-axis direction of the elastic portion 261.

The beam sections 262a and 262b are connected by a beam-section connecting portion 264 on their vertex sides. The beam sections 262c and 262d are connected by another beam-section connecting portion 264 on their vertex sides.

The thickness in the x-axis direction, or in other words, the length from the side surface 263 to the curved surface, of the beam sections 262a to 262d at the position of a length y from the center in the y-axis direction of the elastic portion 261 is the same as the thickness w(y) at the corresponding position of the length y in the parabolic beam 252 illustrated in FIG. 4. In other words, because the elastic portion 261 has a structure in which only one side surface is curved, the thickness of the beam sections of the elastic portion 261 is twice the thickness from the axis of the parabolic beam 252 illustrated in FIG. 4 passing through the vertices in parallel with the y-axis.

Note that the term "substantially parabolic" used herein includes a parabola as well as shapes similar to a parabola.

Because the thickness of the beam sections at a position y in the elastic portion 261 is the same as the thickness at the corresponding position y in the parabolic beam 252 illustrated in FIG. 4, the elastic portion 261 provides the same effects as the elastic portion 251 formed of the parabolic beam 252 illustrated in FIG. 4.

The elastic portions 251 and 261 have been illustrated above as members having a parabolic or substantially parabolic contour. However, the contour of the elastic portions 251 and 261 does not exactly need to be parabolic or substantially parabolic. As described with reference to FIG. 7(A), the rectangular beam has small-stress regions between the central portion and each of the one end and the other end at which the beam is fixed. Providing thin portions in these small-stress regions to reduce the rigidity of these regions can make the stress on the entire surface of the elastic portions 251 and 261 more uniform, thereby achieving equivalent effects.

The above embodiment has illustrated the structure in which a side surface of the elastic portion 152 of the fixed portion 150 is curved, and the slit 153 provided between the elastic portion 152 and the fixed portion body includes the first slit portion 153a of a smaller slit width and the second slit portions 153b of a greater slit width.

However, the effects provided by the parabolic or substantially parabolic contour of the elastic portion 152 can be acquired irrespective of whether or not the slit 153 includes multiple slits of different slit widths.

Further, the effects provided by the slit 153 including multiple slits of different slit widths can be acquired irrespective of whether or not the contour of the elastic portion 152 is parabolic or substantially parabolic.

The MEMS element 10 may therefore be produced either by forming a side surface of the elastic portion 152 to be curved or by forming the slit 153 to include multiple slits of different slit widths, rather than by both.
(Variations of Fixed Portion and Movable Portion)

Figure 10:
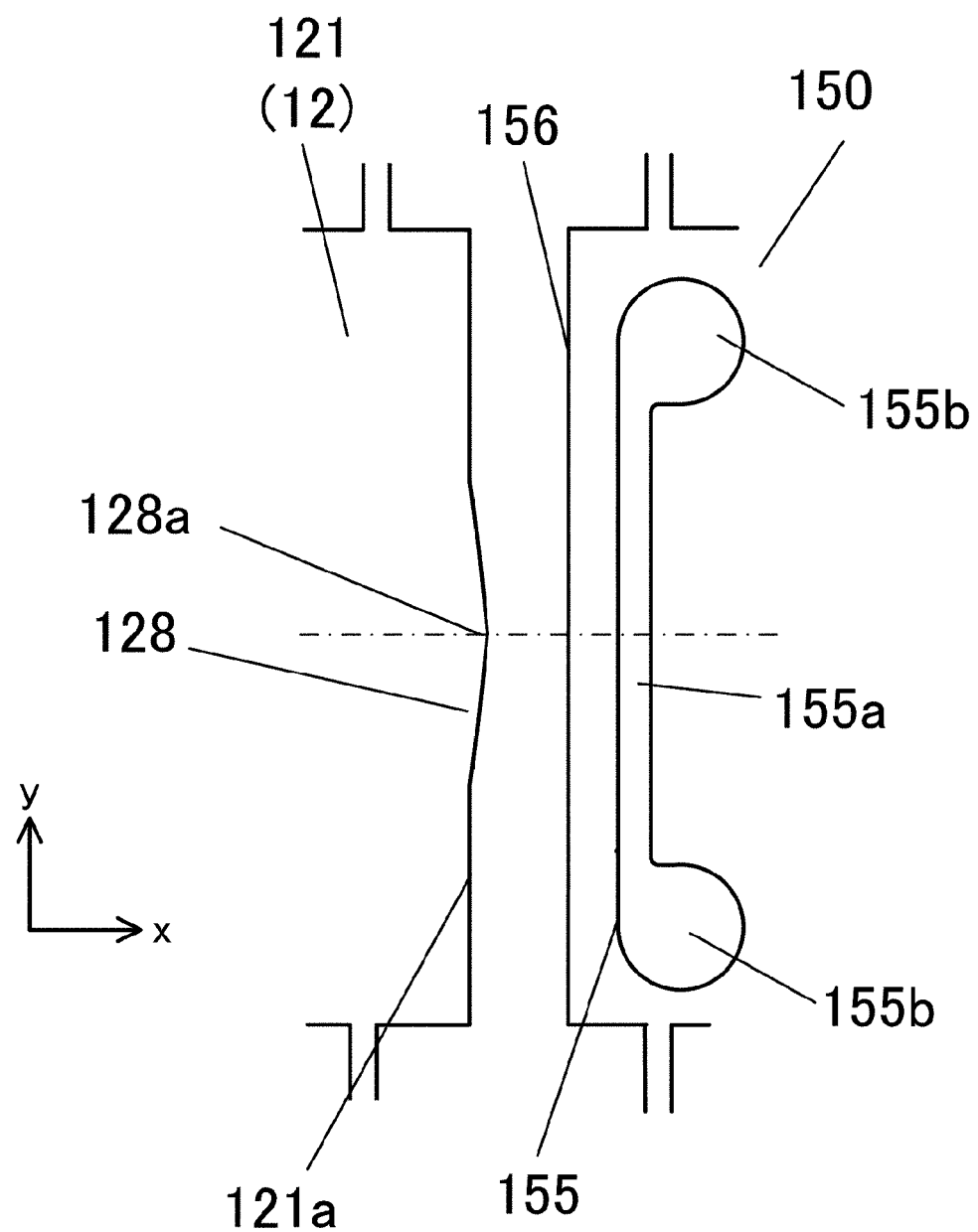
FIG. 10 is a plan view illustrating a variation of the structure of the movable portion and a fixed portion constituting the MEMS element.

FIG. 10 is a plan view illustrating a variation of the movable portion and the fixed portion.

In the fixed portion 150 illustrated in FIG. 10, a side surface 156 facing the center band portion 121 of the movable electrode portion 12 extends straight in the y-axis direction and has no protruding surface. On the other hand, the one side surface 121a of the center band portion 121 of the movable electrode portion 12 facing the fixed portion 150 has a protruding portion 128 protruding toward the movable electrode portion 12. The protruding portion 128 has a tip portion 128a provided at a position corresponding to the center in the y-axis direction of the fixed portion 150.

A slit 155 provided in the fixed portion 150 includes a first slit portion 155a provided in the central portion, and substantially circular second slit portions 155b provided on both sides in the y-axis direction of the first slit portion 155a.

In this manner, the protruding portion 128 may be provided in the movable electrode portion 12. The second slit portions 155b may be circular or elliptic.

Although the above embodiment has illustrated the structure in which the elastic portion 152 is provided in the fixed portion 150, the elastic portion 152 may be provided in the movable electrode portion 12.

According to the above embodiment, the following effects are achieved.

(1) The MEMS element 10 includes the base 7, the movable electrode portion (movable portion) 12, and the fixed portions 150 each including the elastic portion 152 and the fixed portion body 151. The elastic portion 152 extends in a direction intersecting the moving direction of the movable electrode portion 12, includes a central portion receiving the force of the center band portion 121 of the movable electrode portion 12, and one end and the other end fixed to the fixed portion body 151, and includes thin portions respectively between the central portion and the one end and between the central portion and the other end. The thin portions are thinner than the central portion, the one end, and the other end. If the elastic portion 152 had a rectangular beam structure, stress on the elastic portion 152 due to an external force acting on the central portion would be smaller on the surfaces of side surfaces between the central portion and the one end and between the central portion and the other end than on the surfaces of side surfaces of the central portion, the one end, and the other end. The structure in this embodiment has the thin portions provided in the small-stress regions between the central portion and the one end and between the central portion and the other end. Consequently, stress on the surfaces of the side surfaces of the thin portions of the elastic portion 152 increases, resulting in an improvement to make the stress on the entire surface of the side surface of the elastic portion 152 more uniform. This allows increasing the spring constant and therefore increasing the elastic energy held in deformation, while reducing the size of the elastic portion. As a result, damages to the elastic portion 152 from strong external forces can be prevented.

(2) The elastic portion 152 is formed to have a gently curved surface between the central portion and the thin portions so that substantially uniform stress occurs in these regions. By uniforming the stress occurring between the central portion and the thin portions, the size of the elastic portion can be reduced.

Damages to the regions between the central portion and the thin portions of the elastic portion 152 can also be prevented.

(3) The side surface of the central portion of the elastic portion 152 facing the center band portion 121 of the movable electrode portion 12 protrudes toward the center band portion 121 of the movable electrode portion 12 more than the side surfaces of the thin portions. This can prevent an undesirable rotation moment from being generated in the center band portion 121 of the movable electrode portion 12 when the center band portion 121 hits the elastic portion 152, thereby allowing the movable electrode portion 12 to be effectively translated. As a result, a reduction in power-generation efficiency can be prevented.

(4) The elastic portion 152 is formed of a parabolic beam that includes the second and third beam sections 152b and 152c having substantially parabolic contours integrated together on their basal sides, the first beam section 152a having a substantially parabolic contour connected on its vertex side to the vertex side of the second beam section 152b, and the fourth beam section 152d having a substantially parabolic contour connected on its vertex side to the vertex side of the third beam section 152c. Compared with a case in which the elastic portion 152 is formed of a rectangular beam, the size of the elastic portion can be reduced. For the parabolic beam of the same size as the rectangular beam, the maximum amount of deflection or the spring constant can be increased, allowing an increase in the elastic energy that can be held by the elastic portion 152.

For the elastic portion 152 formed of the parabolic beam as above, the thickness w(y) of the elastic portion 152 is preferably set to substantially satisfy the equation $$w(y)=w0\sqrt{|1-4|y|/L|},$$

where w(y) is the thickness of the parabolic beam at a position y that is a length y away from the center of the beam length of the elastic portion 152, $w_0$ is the thickness at the one end of the elastic portion 152, |y| is the absolute of the length from the center of the beam length of the elastic portion 152 to the position y, and L is the entire length of the beam length of the elastic portion 152.

(5) The MEMS element 10 includes the base 7, the movable electrode portion 12, the and the fixed portions 150 each including the elastic portion 152 and the fixed portion body 151. Each fixed portion 150 includes the slit 153 extending along the elastic portion 152 and provided to penetrate the fixed portion body 151. The elastic portion 152 includes a central portion extending in a direction intersecting the moving direction of the center band portion 121 of the movable electrode portion 12 and receiving the force of the center band portion 121, and one end and the other end fixed to the fixed portion body 151. The slit 153 includes the first slit portion 153a provided to correspond to the central portion of the elastic portion 152, and the second slit portions 153b connected to the first slit portion 153a and provided on the inner side of the elastic portion 152 near the one end and the other end. The second slit portions 153b are formed to have a width in the moving direction of the center band portion 121 greater than the width of the first slit portion 153a in the moving direction of the center band portion 121. Arc-shaped curved portions are provided respectively in the second slit portions 153b near the corner portions 171 at the one end and the other end of the elastic portion 152. The radius of curvature Rb of the arc-shaped curved portions is greater than the radius of curvature Ra of a circle inscribed in the first slit portion 153a. This can prevent stress from being concentrated on the corner portions 171 at the one end and the other end of the elastic portion 152, thereby preventing the elastic portion 152 from being damaged by strong vibrations.

Although the above embodiment has illustrated the MEMS element 10 produced from an SOI substrate, the MEMS element 10 may be produced from a silicon substrate. Alternatively, materials such as glass, metal, and alumina may be used instead of a silicon substrate.

The above embodiment has illustrated the MEMS element 10 used for a vibration-driven energy-harvesting element. However, the MEMS element 10 may be used for a vibration actuator that vibrates the movable electrode portion by receiving a drive voltage from outside. A vibration actuator allows producing various devices that utilize vibrations of the movable electrode portion. Further, the MEMS element 10 according to this embodiment can be used for various types of sensors.

While various embodiments and variations have been described above, the present invention is not limited to these details. The various embodiments and variations described above may be combined or may be modified as appropriate, and other aspects contemplated within the scope of the technical concept of the present invention are also within the scope of the present invention.

The disclosure of the following priority application is incorporated herein by reference.

Japanese Patent Application No. 2019-187153 (filed on Oct. 10, 2019)

REFERENCE SIGNS LIST 1 vibration-driven energy-harvesting device
7 base
10 MEMS element
11 fixed electrode portion
12 movable electrode portion (movable portion)
13 elastic supporting portion
110 fixed teeth
120 movable teeth
121 center band portion
121a one side surface
128 protruding portion
150 fixed portion
151 fixed portion body
152 elastic portion
152a-152d beam section
153 slit
153a first slit portion 153b second slit portion
154 beam-section connecting portion
155 slit
155a first slit portion
155b second slit portion
161 side surface
163 inner side surface
171 corner portion
251 elastic portion
252 parabolic beam
252a first beam section
252b second beam section
252c third beam section
252d fourth beam section
254 beam-section connecting portion
261 elastic portion
262a-262d beam section
264 beam-section connecting portion

The invention claimed is:

1. A MEMS element comprising:
a base;
a movable portion fixed to the base in at least a portion of the movable portion and movable in a predetermined direction; and
a fixed portion fixed to the base in at least a portion of the fixed portion, the fixed portion including:
an elastic portion provided to be opposed to the movable portion; and
a fixed portion body to which the elastic portion is fixed, wherein
the elastic portion:
extends in a direction intersecting a moving direction of the movable portion,
includes a central portion receiving a force of the movable portion,
includes a first end and a second end fixed to the fixed portion body,
includes thin portions respectively between the central portion and the first end and between the central portion and the second end, the thin portions being thinner than the central portion, the first end, and the second end, and
is formed to have a gently curved surface between the central portion and each thin portion.

2. The MEMS element according to claim 1, wherein a side surface of the central portion of the elastic portion facing the movable portion protrudes toward the movable portion more than side surfaces of the thin portions.

3. The MEMS element according to claim 1, wherein a side surface of the movable portion facing the fixed portion has a protruding portion opposed to the central portion of the fixed portion.

4. The MEMS element according to claim 1, wherein a slit extending along the elastic portion and penetrating the fixed portion body is provided between the elastic portion and the fixed portion body, and
a side surface of the elastic portion facing the movable portion is formed to be gently curved to allow stress generated by the force received from the movable portion to be substantially uniform across a surface of the central portion and surfaces of the thin portions.

5. The MEMS element according to claim 1, wherein the elastic portion includes four beam sections,
a slit extending along the elastic portion is provided between the elastic portion and the fixed portion body, and
at least one of a side surface of the elastic portion facing the movable portion and a side surface of the elastic portion closer to the slit has a substantially parabolic structure including: a first beam section having a substantially parabolic curved surface with a basal portion fixed to a first end of the fixed portion body; a second beam section having a substantially parabolic curved surface connected with the first beam section on a vertex side; a third beam section having a substantially parabolic curved surface integrated with the second beam section in a basal portion; and a fourth beam section having a substantially parabolic curved surface connected with the third beam section on a vertex side and fixed to a second end of the fixed portion body in a basal portion.

6. The MEMS element according to claim 5, wherein the side surface of the elastic portion facing the movable portion, between the central portion and the first end of the elastic portion, has a shape such that a substantially parabolic curved surface extending from a center of the central portion is coupled with a substantially parabolic curved surface extending from the first end at vertices of the substantially parabolic curved surfaces, and
the side surface of the elastic portion closer to the slit is formed flat.

7. The MEMS element according to claim 5, wherein a thickness w (y) of the elastic portion is set to substantially satisfy an equation $$w(y)=w_0\sqrt{|1-4|y|/L|},$$

where w(y) is a thickness of a parabolic beam at a position y that is a length y away from a center of a beam length of the elastic portion, $w_0$ is a thickness at the first end of the elastic portion, |y| is an absolute of the length from the center of the beam length of the elastic portion to the position y, and L is an entire length of the beam length of the elastic portion.

8. The MEMS element according to claim 1, wherein a slit extending along the elastic portion is provided between the elastic portion and the fixed portion body, and
the slit includes a first slit portion provided to correspond to the central portion of the elastic portion, and second slit portions connected to the first slit portion and provided on an inner side of the elastic portion near the first end of the elastic portion and the second end of the elastic portion, and a width of the second slit portions in the moving direction of the movable portion is greater than a width of the first slit portion.

9. The MEMS element according to claim 8, wherein a stopper portion is provided in a region of the fixed portion body opposed to the first slit portion, and
a tip surface of the stopper portion is an ultimate regulating tip surface that ultimately regulates the force of the movable portion received via the elastic portion.

10. A MEMS element comprising:
a base;
a movable portion fixed to the base in at least a portion of the movable portion and movable in a predetermined direction; and
a fixed portion including:
a fixed portion body fixed to the base in at least a portion of the fixed portion body; an elastic portion fixed to the fixed portion body; and a slit extending along the elastic portion between the elastic portion and the fixed portion body and provided to penetrate the fixed portion body, wherein the elastic portion has a beam structure including: a central portion extending in a direction intersecting a moving direction of the movable portion and receiving a force of the movable portion; and a first end and a second end fixed to the fixed portion body, and the slit includes a first slit portion provided to correspond to the central portion of the elastic portion, and second slit portions connected to the first slit portion and provided on an inner side of the elastic portion near the first end and the second end, the second slit portions are formed to have a width in the moving direction of the movable portion greater than a width of the first slit portion, arc-shaped curved portions are provided respectively in the second slit portions near corner portions at the first end and the second end of the elastic portion, and a radius of curvature of the arc-shaped curved portions is greater than a radius of curvature of a circle inscribed in the first slit portion.

11. The MEMS element according to claim 10, wherein the elastic portion includes thin portions respectively between the central portion and the first end and between the central portion and the second end, the thin portions being thinner than the central portion, the first end, and the second end.

12. The MEMS element according to claim 1, wherein the base, the fixed portion, and the movable portion are made of silicon.

13. The MEMS element according to claim 12, wherein the movable portion includes a plurality of movable teeth and a tooth-connecting portion connecting the plurality of movable teeth, and the fixed portion includes a plurality of fixed teeth, the plurality of movable teeth of the movable portion being inserted into and retracted from gaps between the plurality of fixed teeth.

14. The MEMS element according to claim 13, wherein an electret is formed in at least one of: each of the plurality of movable teeth; and each of the plurality of fixed teeth.

15. A vibration-driven energy-harvesting device comprising:
the MEMS element according to claim 1;
an elastic supporting portion via which the movable portion of the MEMS element is elastically supported to the fixed portion; and
an output portion outputting electric power generated by vibration of the movable portion with respect to the fixed portion.

16. The MEMS element according to claim 10, wherein the base, the fixed portion, and the movable portion are made of silicon.

17. A vibration-driven energy-harvesting device comprising:
the MEMS element according to claim 10;
an elastic supporting portion via which the movable portion of the MEMS element is elastically supported to the fixed portion; and
an output portion outputting electric power generated by vibration of the movable portion with respect to the fixed portion.

* * * * *